(12) United States Patent
Seko

(10) Patent No.: US 6,320,891 B1
(45) Date of Patent: Nov. 20, 2001

(54) SURFACE EMITTING SEMICONDUCTOR LASER

(75) Inventor: Yasuji Seko, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/520,902

(22) Filed: Mar. 7, 2000

(30) Foreign Application Priority Data

Mar. 16, 1999 (JP) ................................. 11-071072

(51) Int. Cl.[7] ................................................ H01S 5/183
(52) U.S. Cl. .................................... 372/50; 372/96
(58) Field of Search ............................... 372/96, 50

(56) References Cited

U.S. PATENT DOCUMENTS

| 5,136,603 | 8/1992 | Hasnain et al. ..................... 372/50 |
| 5,748,661 | 5/1998 | Kiely et al. ......................... 372/50 |
| 5,757,837 | 5/1998 | Lim et al. ........................... 372/50 |
| 5,887,013 | * 3/1999 | Lee et al. ........................... 372/50 |

FOREIGN PATENT DOCUMENTS

| 8-330661 | 12/1996 | (JP) . |
| 9-260765 | 10/1997 | (JP) . |

* cited by examiner

Primary Examiner—James W. Davie
(74) Attorney, Agent, or Firm—Oliff & Berridge, PLC

(57) ABSTRACT

A surface emitting semiconductor laser and a surface emitting semiconductor laser array having a photodetector capable of monitoring the light output of a laser easily at a high speed without deteriorating the performance of a surface emitting laser. An n type GaAs optical absorbing layer having an opening in the center of a waveguide path is inserted between the p type DBR layer and the spacer layer of the surface emitting semiconductor laser as a light receiving part and a PD electrode which takes out electrons generated in this optical absorbing layer is formed on the optical absorbing layer.

15 Claims, 15 Drawing Sheets

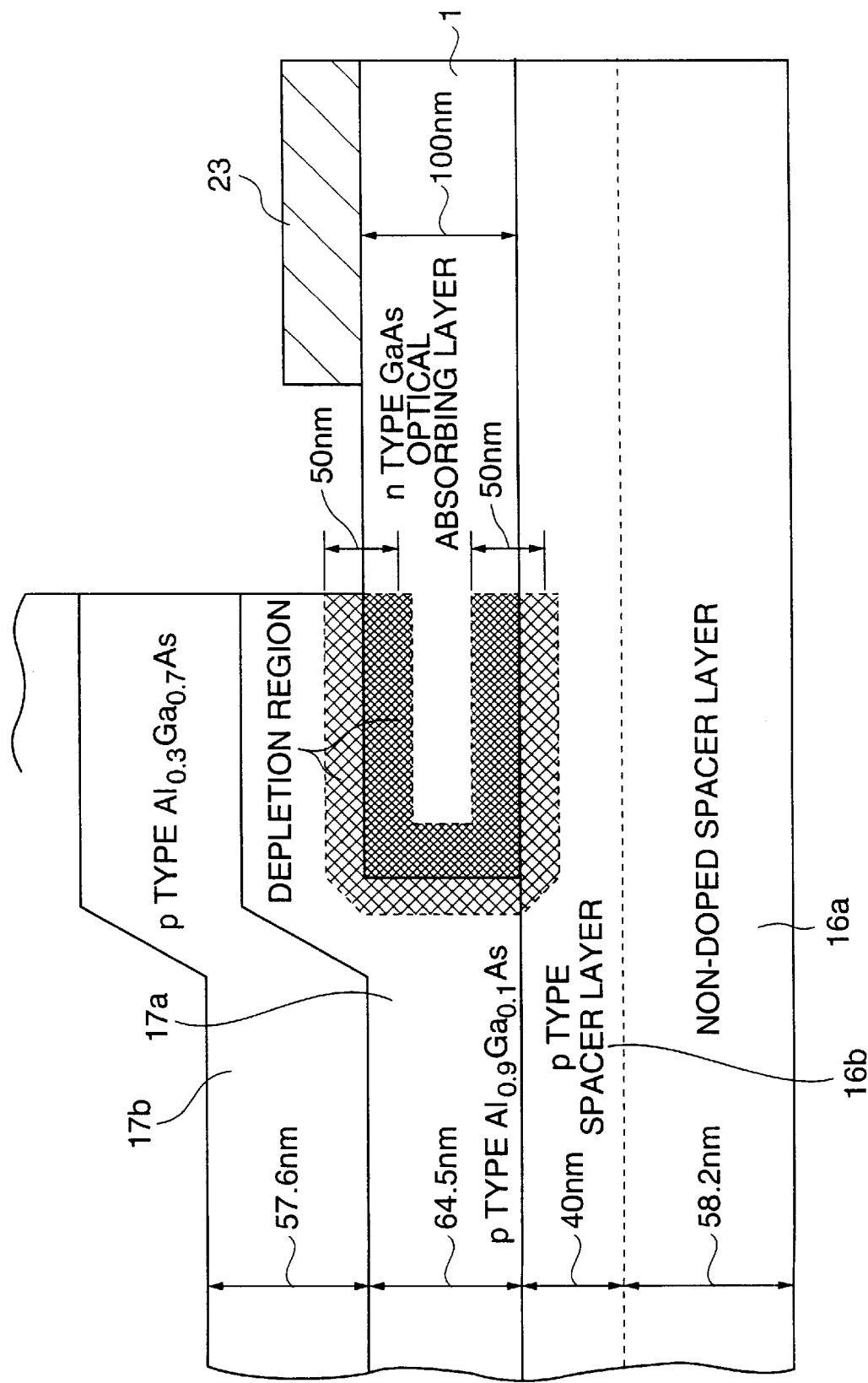

FIG.6
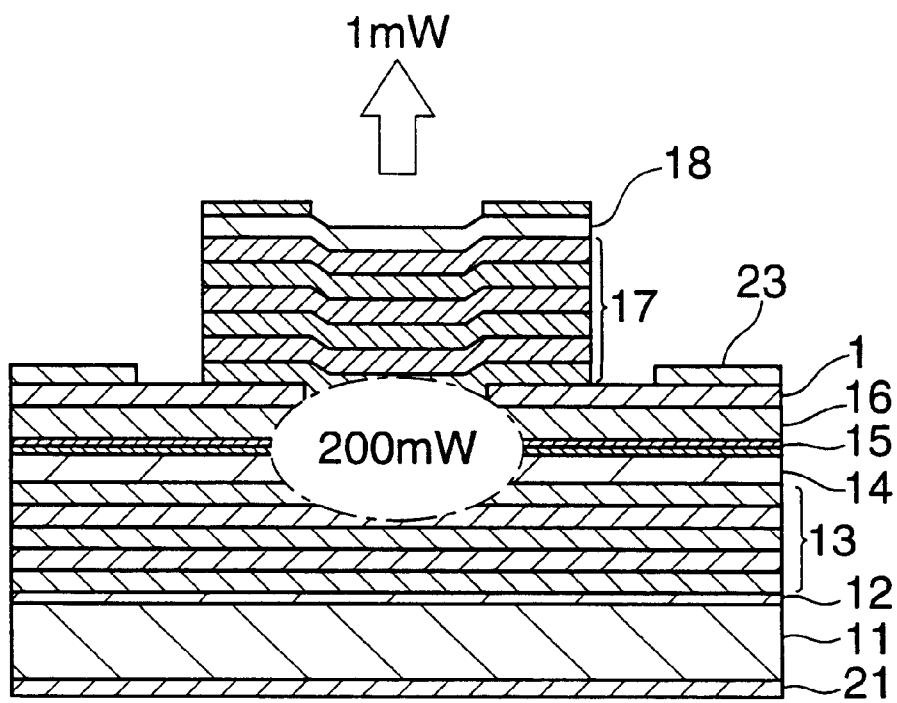
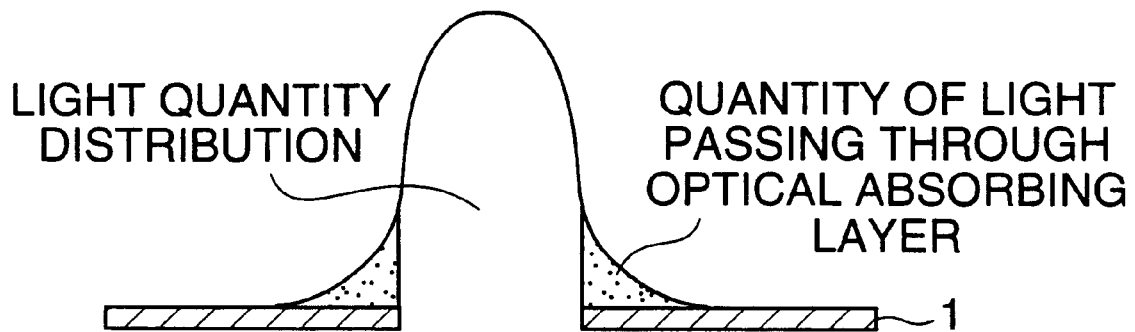
LIGHT QUANTITY DISTRIBUTION
QUANTITY OF LIGHT PASSING THROUGH OPTICAL ABSORBING LAYER

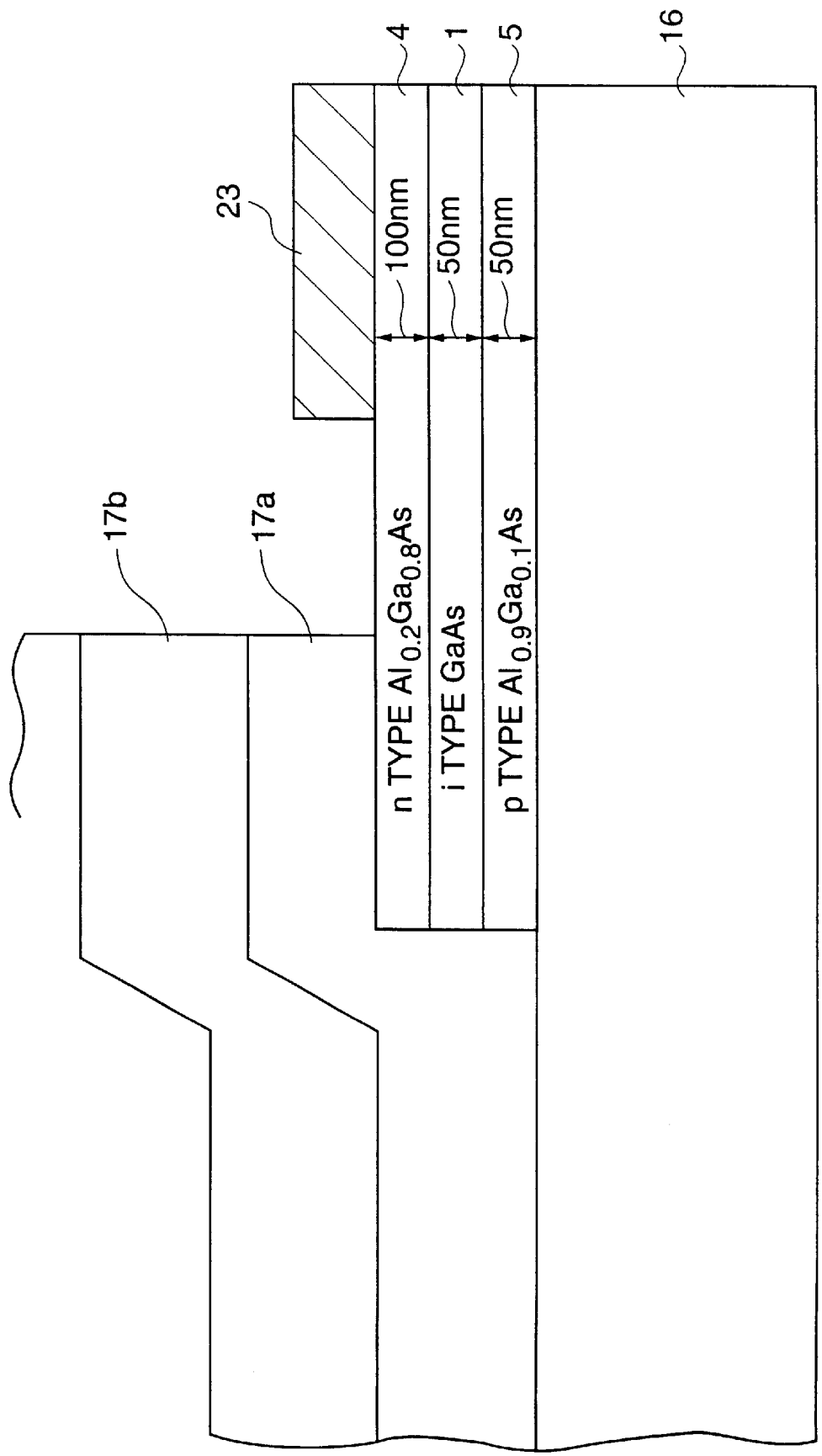

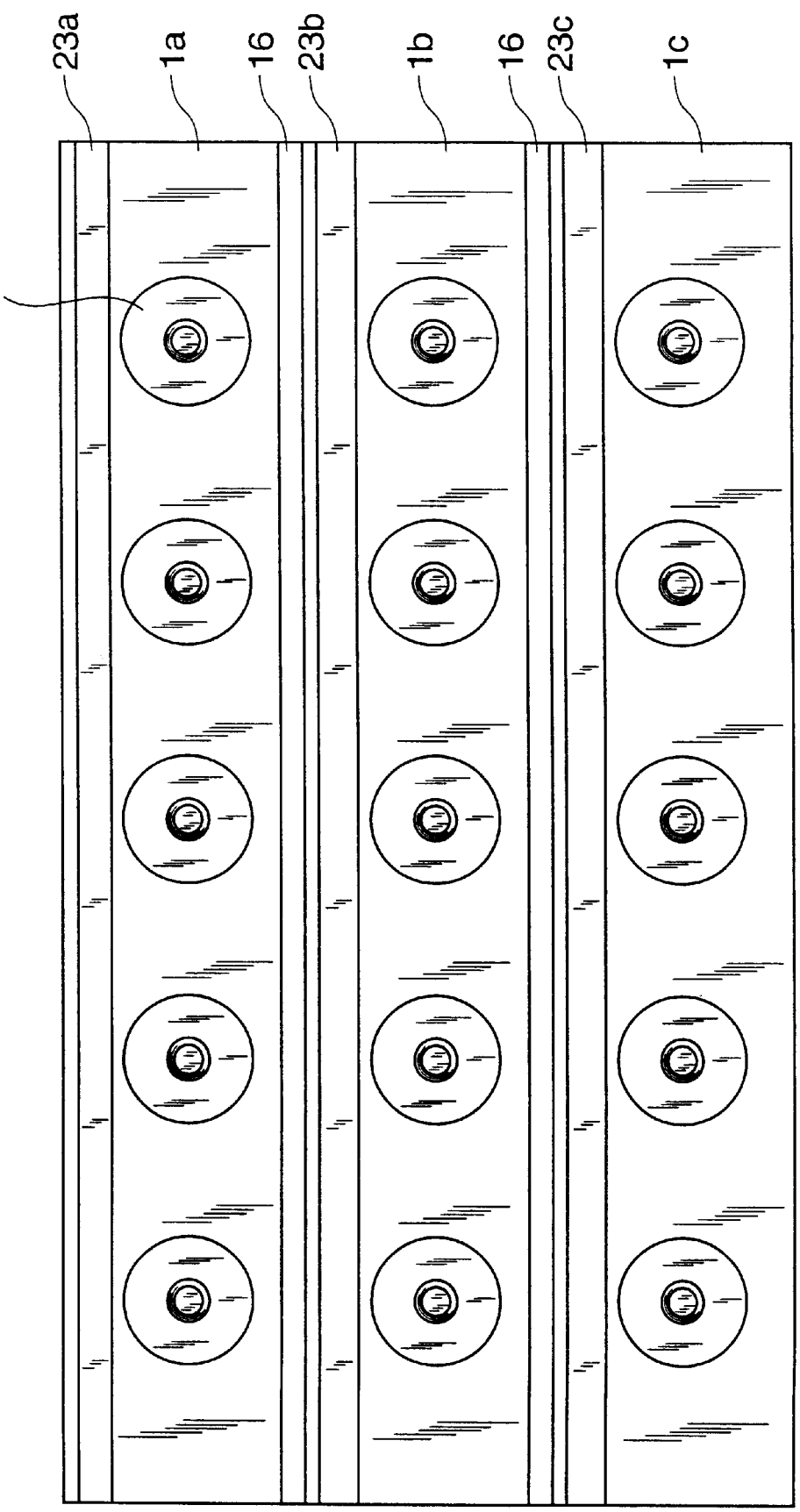

SURFACE EMITTING SEMICONDUCTOR LASER

BACKGROUND OF THE INVENTION

1. Field of the Invention

The present invention relates to a surface emitting semiconductor laser and a surface emitting semiconductor laser array which are used as a light source for optical disks, laser printers and laser displays.

2. Description of the Related Art

As the method of monitoring the light output of a surface emitting laser, there is proposed a method of monitoring light split by a beam splitter provided at the light emission window of a laser element package with light receiving elements provided in the package (Japanese Published Unexamined Patent Application No. Hei 8-330661). However, in this method, the laser package has a special structure and a general-purpose product cannot be used, thereby increasing costs. In addition, the beam splitter and the light receiving elements having a relatively large area are used, thereby boosting costs. In this method, when a surface emitting laser generates multiple beams, beam outputs cannot be monitored independently and the whole size of the laser cannot be made compact. Therefore, a technology for forming a photodetector on a surface emitting laser monolithically is desired.

As the method of forming a photodetector monolithically, there are proposed a method of forming light receiving elements on the structure layer of a surface emitting laser and a method of forming light receiving elements in parallel next to a surface emitting laser.

The method of forming light receiving elements on the structure layer of a surface emitting laser is first proposed by U.S. Pat. No. 5,136,603. This method is to monitor the light output of a surface emitting laser by forming an i type layer and an n type layer on a p type DBR (distributed Bragg reflector) mirror layer on the front side of the laser to form a columnar pin photodetector and causing the laser to emit light through the pin photodetector. However, in this structure, the pin photodetector destroys the cyclic structure of the DBR mirror, thereby reducing reflectance. Since an p type electrode formed in the p type DBR is shaped like a ring surrounding the columnar pin photodetector, a current injected from this electrode concentrates on the peripheral portion of the light emitting part of an active layer, whereby an output light intensity distribution hardly becomes a unimodal convex but has a high-order horizontal mode. This causes such a problem that the laser cannot be used as a light source for optical disks and laser printers.

U.S. Pat. No. 5,757,837 improves the above invention of U.S. Pat. No. 5,136,603 and proposes a structure that an intra-cavity type pin photodetector is embedded in a DBR mirror on the front side of an intra-cavity type surface emitting laser. Since this laser has an intra-cavity structure, as shown in FIG. 15A, a laser drive electrode (p type electrode 50) on the front side of a substrate is formed on an upper spacer layer 16 or at an intermediate position of a DBR mirror 17. An n type electrode 21 for driving a laser is formed on the rear side of the substrate.

The pin photodetector is constituted such that a quantum well which is an optical absorber layer is made from 80 λ-$Ga_{0.8}In_{0.2}As$, sandwiched between GaAs spacer layers and further sandwiched between laminatestructured DBR mirrors having a thickness of λ/4. This photodetector shares a p type electrode 50 for driving a laser as the p type electrode of the photodetector, and a reverse bias is applied by a power source 54 to a space between an n type electrode 52 for a photodetector formed on the top surface and the p type electrode 50 to monitor the quantity of laser light with an ammeter 56.

In this patent, the structure of the surface emitting laser is formed of an intra-cavity type to prevent a laser drive current from running into the photodetector. However, this intra-cavity type surface emitting laser having the photodetector formed monolithically has the following problems.

Since the p type electrode 50 is formed outside thepost-shaped upperDBRmirror in the intra-cavity type surface emitting laser, the hole of the ring of the p type electrode 50 becomes large. Therefore, a current injected into the active layer from the p type electrode 50 concentrates upon the peripheral portion of the light emitting part. Accordingly, the horizontal mode is apt to become a high-order mode and a unimodal light intensity distribution is hardly obtained. To prevent these to some degree, a current strangulation structure for reducing the diameter of a current path is generally formed in a spacer layer or a DBR mirror near the spacer layer. In spite of this, a current concentrates upon a portion around the current path and a light emitting part concentrates upon that portion. A current injected into the active layer from the p type electrode moves in a horizontal direction, resulting in large electric resistance. Particularly when the p type electrode is formed on the spacer layer, a current moves horizontally in the narrow spacer layer, resulting in a large resistance value.

In this intra-cavity type surface emitting laser, since the pin structure of the photodetector is a quantum well structure, photocarriers generated in the quantum well by optical absorption are kept in the quantum well and hardly taken out to the outside. Therefore, the current value greatly depends on a reverse bias voltage applied to the photodetector. Therefore, to monitor laser light properly, voltage applied to the p type electrode 50 and the n type electrode 52 of the photodetector must be maintained at a fixed level. That is, as shown in FIG. 15A, while the potential of the p type electrode 50 shared by the laser and the photodetector is grounded and a fixed reverse bias voltage is applied to the n type electrode 52 of the photodetector, the laser is driven by operating the potential of the n type electrode 21 for driving a laser. FIG. 3B shows an equivalent circuit for a surface emitting laser having this photodetector. In the case of a single-beam laser, this drive method has no problem. However, in the case of a multi-beam laser, since an n type DBR mirror is generally electrically connected, all the lasers can be driven simultaneously and hence, this drive method cannot be employed. To eliminate this problem, as shown in FIG. 15B, lasers which are grown on a semi-insulating substrate 58 must be isolated from one another by etching. However, this case involves serious problems that the production process becomes complicated and that surface emitting lasers cannot be arranged at a small pitch.

U.S. Pat. No. 5,748,661 proposes a method of forming light receiving elements in parallel next to a surface emitting laser. In this patent, a cylindrical photodetector is formed to surround a columnar surface emitting laser so as to detect natural emission light leaked from the surface emitting laser. Since natural emission light not contributing to laser oscillation and not laser oscillation light is detected in this method, the quantity of light detected increases as the amount of an injection current becomes larger until a laser oscillates. However, once the laser oscillates, the quantity of natural emission light rarely increases even when the amount of an injection current grows. Therefore, an increase in the current value for monitoring the quantity of light is extremely small though the quantity of laser light increases, thereby making it impossible to carry out monitoring properly. Further, since the photodetector has the same pin structure as the surface emitting laser, carriers generated in the active layer which is an i layer are kept in a potential well and hardly taken out to the outside. As the intensity of natural emission light is low, the value of current generated in the photodetector by the light is small, thereby making difficult the detection of the natural emission light.

As described above, in the method of forming a pin photodetector structure in the laminate structure of an intra-cavity type surface emitting laser monolithically as disclosed by U.S. Pat. No. 5,757,837, the insertion position of the photodetector is farther away from an active layer than a pair of laser drive electrodes for flowing a current in the laser active layer. Therefore, the surface emitting laser has an intra-cavity structure and the laser drive electrodes are shaped like a ring surrounding the photodetector. As a result, a laser drive current concentrates upon the peripheral portion of the light emitting part of the active layer and an emission light intensity distribution is apt to become a multi-mode and not a single-mode. At the same time, the current path is formed in a horizontal direction or an oblique direction with the result that its electric resistance becomes high or its production process becomes complicated, thereby reducing laser performance. Since a conventional pin photodetector inserted into the laminate structure of a DBR mirror has a double-hetero structure such as a quantum well structure, a current generated by optical absorption is hardly taken out to the outside. At the same time, since the value of current taken out to the outside from the photodetector greatly depends on a reverse bias voltage applied to the photodetector, the reverse bias voltage must be maintained at a fixed level. Under the conditions that the p type electrode for a laser (which is also a p type electrode for the photodetector) is grounded as a common electrode and the potential of the n type electrode for a photodetector is fixed, the laser must be driven with the n type electrode on the rear side of a substrate for driving a laser. Therefore, in the case of a multibeam laser, after laser crystals are grown on a semi-insulating substrate, each laser element must be isolated by etching, thereby making its production process and electrode wiring structure complicated. Therefore, a laser array having a narrow pitch cannot be manufactured.

The present invention has been made in view of the above problems of the prior art and provides a surface emitting semiconductor laser having a photodetector capable of monitoring the light output of the laser easily at a high speed without deteriorating the performance of the surface emitting laser. The present invention further provides a surface emitting semiconductor laser array having a photodetector capable of monitoring the light output of each laser with a simple structure.

SUMMARY OF THE INVENTION

The inventors of the present invention have conducted intensive studies and have found that the above problems can be solved by the following device.

That is, according to an aspect of the present invention, a surface emitting semiconductor laser has an active region, a pair of spacer layers sandwiching the active region, a pair of DBR mirrors sandwiching the pair of spacer layers, and a pair of laser drive electrodes sandwiching a region including at least the pair of spacer layers and which outputs laser light from an optical waveguide path by applying voltage to the laser drive electrodes. The laser further includes a photodetector having a light receiving part which is provided at least in the optical waveguide path except the centerline of the optical waveguide path, and generates carriers by absorbing laser light emitted from the active layer and a light receiving part electrode which takes out the carriers generated by the light receiving part.

Since the surface emitting semiconductor laser of the present invention monitors the quantity of light emitted from the active layer, the light receiving part formed from a material having an almost same or a smaller band gap than the active layer is formed in the waveguide path of the surface emitting semiconductor laser. An opening is formed in the light receiving part and located near the center line of the waveguide path. Thereby, a portion near the center line having high light intensity of the waveguide path has the laminate structure of a general surface emitting semiconductor laser and the light receiving part is existent only in the peripheral portion of the waveguide path.

This light receiving part is made a first conductive type (provisionally n type) and the constituent layer of the surface emitting semiconductor laser containing this light receiving part is made a second conductive type (p type). Thereby, a pn junction interface is formed between the light receiving part and the peripheral layer. When the light receiving part is formed by an i layer (optical absorbing layer) and a first conducive charge transport layer, a pin junction interface is formed between the layers and a current generated in the optical absorbing layer is large because the optical absorption of the i layer is large, thereby making it possible to increase light monitoring sensitivity.

Part of the light receiving part extends to the outside of the waveguide path of the surface emitting semiconductor laser and a light receiving part electrode is formed on that extension portion. The light receiving part receives light emitted from the active layer to generate carriers which are taken out by the light receiving part electrode, thereby making it possible to monitor the internal light intensity of the surface emitting semiconductor laser. Since the internal light intensity of the surface emitting semiconductor laser corresponds to the intensity of light emitted to the outside, the light output of the surface emitting semiconductor laser can be monitored successively with the constitution of the present invention.

In the present invention, as a pn junction or pin junction interface is formed between the light receiving part having an opening and the constituent layer of the surface emitting semiconductor laser, it functions as a potential barrier for a current running through the constituent layer of the surface emitting semiconductor laser, thus preventing the current. Therefore, when the opening is formed in the path of a laser drive current, a current can run only in the opening of the light receiving part. Consequently, a current can be concentrated in the active layer right below or right above the opening by forming a light receiving part in the spacer layers sandwiching the active layer or outside the spacer layers, thereby making it possible to contribute to an increase in the performance of the laser.

Since the light receiving part of the present invention has an opening near the center portion of the optical waveguide path, it does not reduce the reflectance of the DBR mirrors. That is, the quantity of laser light can be monitored without deteriorating the performance of the laser.

The photodetector of the present invention does not need to have a quantum well structure unlike that of U.S. Pat. No. 5,757,837 and it is possible to prevent photocarriers from being kept in the well. Therefore, a current taken out from the photodetector does not depend on reverse bias voltage to the photodetector and is always constant, thereby making it possible to monitor the quantity of light stably. The reverse bias voltage affects the speed of a current taken out from the photodetector.

In the present invention, reverse bias to be applied to the photodetector is determined by the potentials of an n type electrode for a laser and a p type electrode for a photodetector and has no connection with changes in the potential of a p type electrode for driving a laser. This is because the electric resistance of a p type DBR mirror is very large and the electric resistance of an n type DBR mirror can be ignored in a surface emitting semiconductor laser having an n 3type electrode for driving a laser formed on the entire rear surface of an n type substrate. That is, the electric resistivity of the n type DBR mirror is approximately 1/10 the electric resistivity of the p type DBR mirror material and the cross section through which a current flows of the n type DBR mirror can be made 100 times or more larger than that of the p type DBR mirror, whereby the electric resistance of the n type DBR mirror becomes 1/1,000 or less that of the p type DBR mirror. Therefore, since almost fixed reverse bias is applied to the photodetector regardless of the potential of the p type electrode for driving a laser, the quantity of laser light can always be monitored accurately.

As shown in FIG. 2A, the quantity of laser light can be monitored accurately by grounding the n type electrode for driving a laser formed on the rear surface of an n type substrate and fixing the potential of the n type electrode of the photodetector at a certain value. The circuit configurations of the present invention and the prior art are shown in FIGS. 3A and 3B. It is apparently understood from FIGS. 3A and 3B that the present invention differs from the prior art in the position of the common electrode to be grounded.

As shown in FIG. 2B, in a multi-beam laser, when the p type DBR mirror of each laser is driven independently while a common electrode is formed on the rear surface of the n type substrate like the single-beam laser and the potential of the n type electrode for a photodetector is fixed at a certain value, the light output of each laser can be monitored.

In the case of the multi-beam laser, the light outputs of all the lasers can be monitored properly with one light receiving part electrode and one drive circuit provided for the light receiving part formed on the entire surface by making the light receiving part spread on the entire surface or electrically connected without isolating the light receiving part for each laser. Therefore, the surface emitting semiconductor laser can be made simple in structure and reduced in cost.

BRIEF DESCRIPTION OF THE DRAWINGS

Preferred embodiments of the present invention will be described in detail based on the followings, wherein:

FIG. 5 schematically shows the pn junction interface of the light receiving part of the surface emitting semiconductor laser of the present invention;

FIG. 6 illustrates a relationship between the position of the light receiving layer of the surface emitting semiconductor laser of the present invention and a light intensity distribution in the resonator of the laser;

FIG. 8 is a schematic sectional view showing the constitution of the light receiving part of a surface emitting semiconductor laser according to a third embodiment of the present invention;

FIG. 14 is a top view showing the arrangement of other elements of the surface emitting semiconductor laser array according to the eighth embodiment of the present invention.

DETAILED DESCRIPTION OF THE PREFERRED EMBODIMENTS

Preferred embodiments of the present invention will be described in detail hereunder with reference to the accompanying drawings.

First Embodiment

Figure 1A:
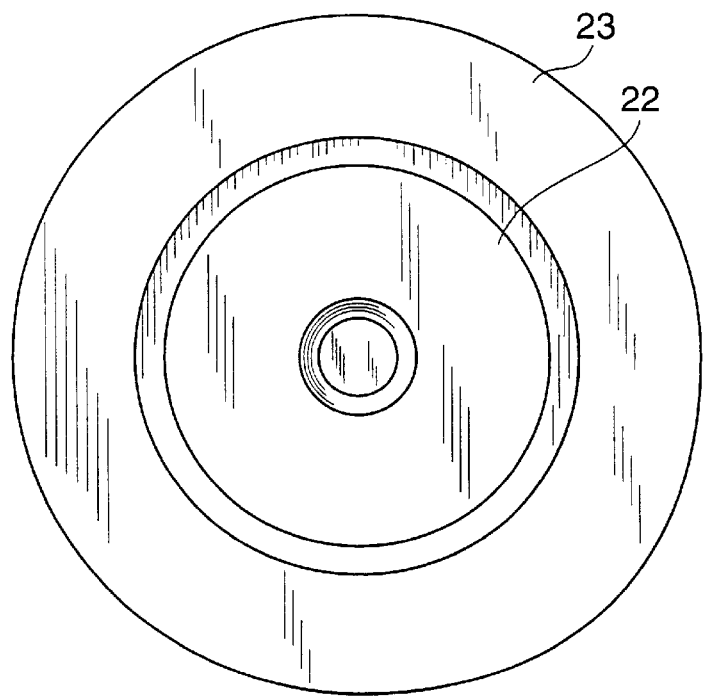
FIG. 1A is a top view of a surface emitting semiconductor laser according to a first embodiment of the present invention.
Figure 1B:
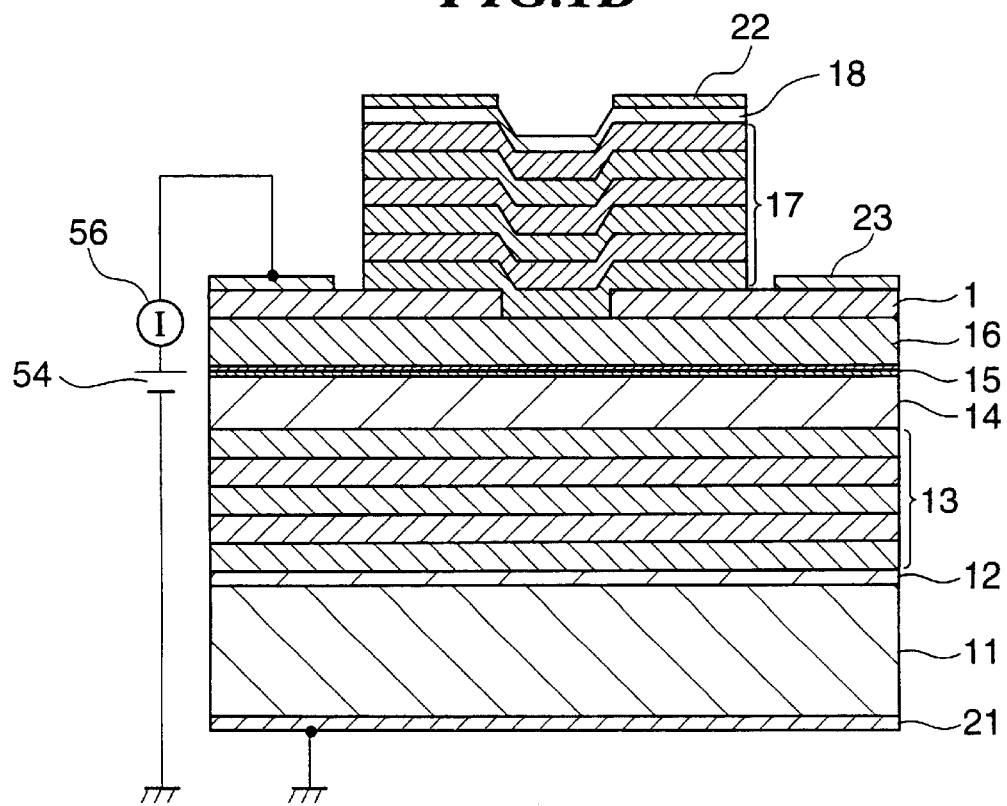
FIG. 1B is a schematic sectional view of the layer structure of the surface emitting semiconductor laser according to the first embodiment of the present invention.

As shown in FIGS. 1A and 1B, a surface emitting semiconductor laser according to a first embodiment has a pn junction photodetector (PD) which includes an n type GaAs optical absorbing layer as a light receiving part inserted between the p type DBR layer 17 and the spacer layer 16 of the surface emitting semiconductor laser. The structure of the surface emitting semiconductor laser will be described hereunder with reference to its production process.

Figure 4A:
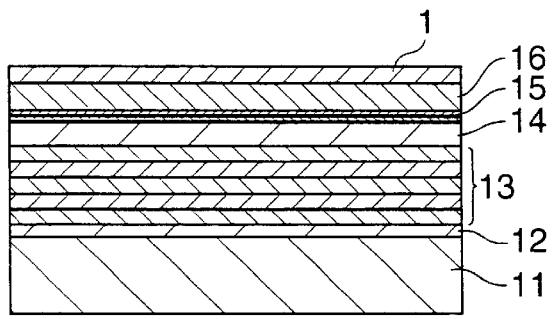
FIGS. 4A to 4E are schematic sectional views showing the production steps of the surface emitting semiconductor laser according to the first embodiment of the present invention.

As shown in FIG. 4A, an n type GaAs buffer layer 12 (thickness of 0.2 $\mu$m, carrier concentration of $2\times10^{18}/cm^3$), an n type $Al_{0.3}Ga_{0.7}As/Al_{0.9}Ga_{0.1}As$ DBR mirror 13 (57.6 nm/64.5 nm×40.5 cycles, $Al_{0.3}Ga_{0.7}As$ on an upper side/ $A_{0.9}Ga_{0.1}As$ on a lower side, carrier concentration of $2 \times 10^{18}/cm^3$), an $Al_{0.6}Ga_{0.4}As$ spacer layer 14 (98.2 nm, non-doped), an $Al_{0.1}Ga_{0.9}As/Al_{0.3}Ga_{0.7}As$ (quantum well layer/barrier layer: 8 nm/5 nm×3 cycles, non-doped) active region 15, an $Al_{0.6}Ga_{0.4}As$ spacer layer 16 (98.2 nm) and n type GaAs optical absorbing layer 1 (thickness of 100 nm, carrier concentration of $2 \times 10^{18}/cm^3$) are formed on a conductive Si doped n type GaAs substrate 11 sequentially. MOCVD (metal organic chemical vapor deposition) was used to grow crystals for a surface emitting semiconductor laser structure.

As shown in FIG. 5, the $Al_{0.6}Ga_{0.4}As$ spacer layer 16 (98.2 nm) has a non-doped spacer layer 16a (58.2 nm) in contact with the active region 15 and a p type spacer layer 16b (40 nm, carrier concentration of $2 \times 10^{18}/cm^3$) formed on the spacer layer 16a.

Figure 4B:
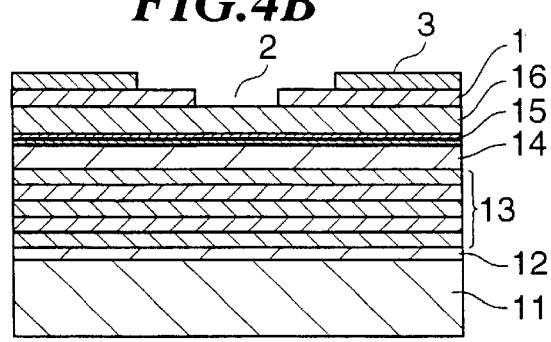

As shown in FIG. 4B, the laminate sample was taken out from an MOCVD system and the center portion of the n type GaAs optical absorbing layer 1 is removed by etching to form a circular opening 2 having a diameter of 5 $\mu$m. Further, an $SiO_2$ insulating film 3 (thickness of 0.1 $\mu$m) is formed on this optical absorbing layer 1 by plasma CVD and an opening having a diameter of 20 $\mu$m larger than the opening 2 is formed in the $SiO_2$ insulating film 3 by etching to expose part of the optical absorbing layer 1 to the surface.

Figure 4C:
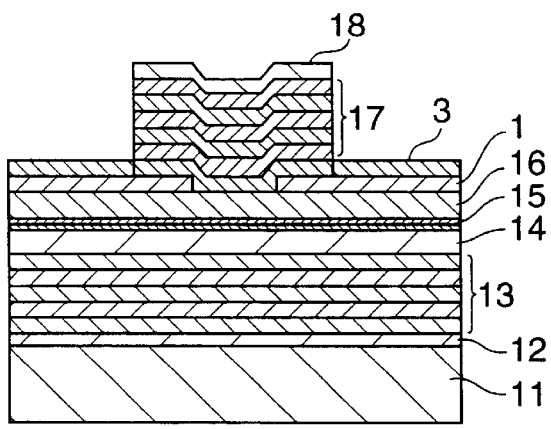

This sample is set in the MOCVD apparatus again to grow a p type $Al_{0.3}Ga_{0.7}As/Al_{0.9}Ga_{0.1}As$ DBR mirror 17 (64.5 nm/57.6 nm×30 cycles, carrier concentration of $2 \times 10^{18}/cm^3$) and a p type contact layer 18 (9 nm, carrier concentration of $1 \times 10^{19}/cm^3$) on the surface of the sample sequentially as shown in FIG. 4C.

As shown in FIG. 5, the p type DBR mirror 17 is formed 30 cycles with a p type $Al_{0.9}Ga_{0.1}As$ layer 17a arranged on a lower side and a p type $Al_{0.3}Ga_{0.7}As$ layer 17b on an upper side. Since crystals do not grow on the $SiO_2$ film 3 (selective growth), the p type DBR mirror 17 having a shape shown in FIG. 4C can be formed.

A graded layer is formed by changing composition gradually at each laminate interface of the DBR mirrors 13 and 18 to reduce electric resistance. The thickness $t_i$ of each layer of the DBR mirrors 13 and 17 satisfies $t_i = \lambda/(4 \cdot n_i)$ ($n_i$ is the refractive index of each layer) for the wavelength $\lambda$ of laser light (780 nm). The DBR mirrors 13 and 17 sandwiching the spacer layer 16 have a high reflectivity of approximately 99.5%. The spacer layer 16 and the active region 15 are designed to have an optical path length equal to the wavelength $\lambda$ and the two DBR mirrors play the role of a laser resonator mirror.

Figure 4D:
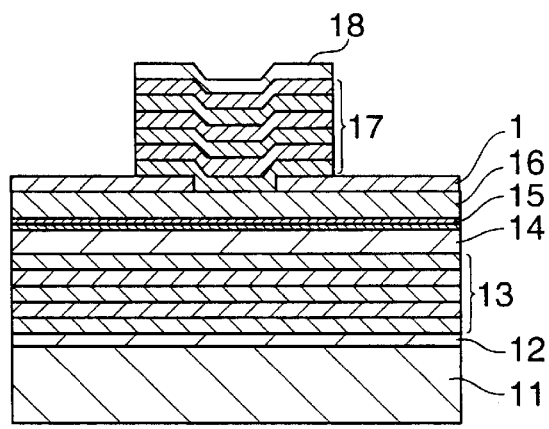
Figure 4E:
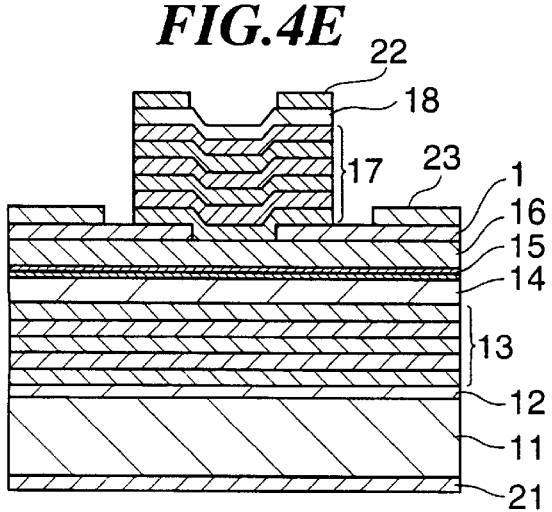

Thereafter, as shown in FIG. 4D, the $SiO_2$ film 3 is removed by etching, an n type electrode 21 (AuGe alloy) is formed on the entire rear surface of the n type GaAs substrate 11 as an electrode for injecting a current into the laser active region 15, a p type electrode 22 (AuZn alloy) is formed on a portion excluding a light output port having a diameter of 5 $\mu$m of the front surface of the p type contact layer 18, and a PD electrode 23 (AuGe alloy) for taking out electrons generated in the n type GaAs optical absorbing layer 1 is formed on the optical absorbing layer 1. These electrodes are formed to a thickness of 30 nm by evaporation deposition and structured as shown in FIG. 4E. A surface emitting semiconductor laser having a photodetector shown in FIGS. 1A and 1B is obtained by connecting this PD electrode 23 to a power source 54 through an ammeter 56.

A description is subsequently given of the operation principle of the photodetector provided in this surface emitting semiconductor laser.

As the optical absorbing layer 1 is an n type conductive layer and the spacer layer 16b and the DBR mirror 17a around the optical absorbing layer 1 are p type layers in FIG. 5, the junction interfaces between them become pn junction interfaces. A depletion region free from carriers is formed near the junction interface. The width of the depletion region is approximately 50 nm from the carrier concentration of each layer and a band gap, and the width of each depletion layer formed in the optical absorbing layer 1 is approximately 25 nm, totaling 50 nm. Since the thickness of the optical absorbing layer 1 is set to 100 nm in this embodiment, the thickness of the optical absorbing layer 1 excluding the depletion layers is 50 nm. Carriers generated in the optical absorbing layer 1 move in this n type conductive optical absorbing layer 1 and can be taken out from the PD electrode 23 at a high speed.

The opening 2 having a diameter of 5 $\mu$m is formed in the optical absorbing layer 1. Therefore, the optical absorbing layer 1 is nonexistent in a region having high light intensity near the center line of the waveguide path of the surface emitting semiconductor laser but existent only in the peripheral portion having low light intensity of the waveguide path. Therefore, light is absorbed by the optical absorbing layer 1, thereby making it possible to generate a current for the detection of the quantity of light without weakening the intensity of output light.

Since the DBR mirrors 13 and 17 generally have a reflectance of 99.5%, the light intensity of the active region 15 is approximately 200 mW when the intensity of output light is 1 mW. When the quantity of light passing through the optical absorbing layer 1 is estimated based on the assumption that a light quantity distribution is a Gaussian distribution as shown in FIG. 6, it is at least 2 mW which is 1/100 or more the total of 200 mW. That is, the average quantity $P_o$ of light passing through the light receiving part of the optical absorbing layer may be considered as 2 mW.

The optical absorbing area of the optical absorbing layer is shaped like a ring having a diameter of 5 to 7 $\mu$m. The total width "t" of the depletion regions formed in the optical absorbing layer is 50 nm as described above. Further, the absorption coefficient $\alpha$ of GaAs for light having a wavelength of 780 nm is 0.8 $\mu m^{-1}$. Since the photoelectric conversion efficiency of GaAs can be estimated at 80% or more, energy Pab generated in the optical absorbing layer is expressed by the following equation:

$$P_{ab} = P_o(1-\exp(-\alpha \cdot t)) \times 0.8.$$

When the above figures are inserted into this equation, $P_{ab}$ is 64 $\mu$W.

Figure 3B:
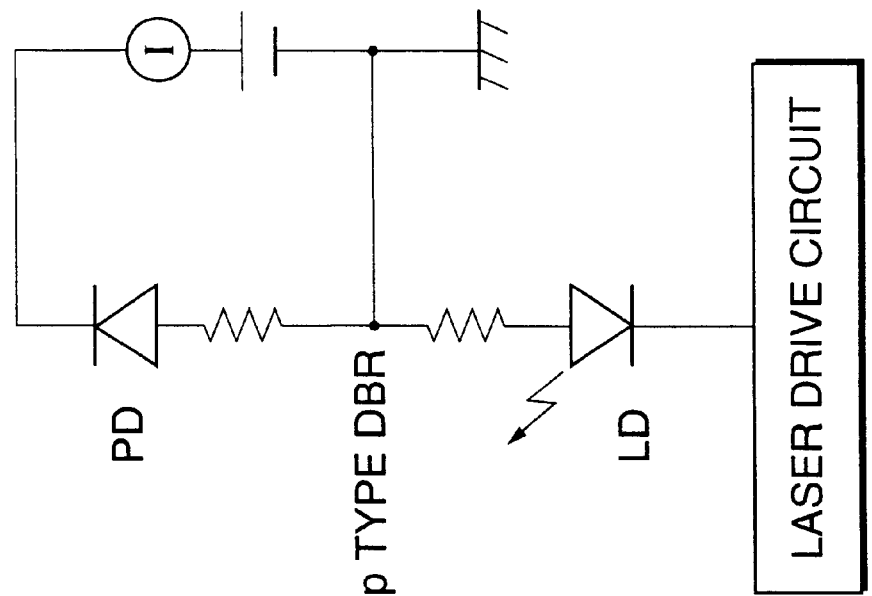
FIG. 3A is a circuit diagram of a drive circuit for the surface emitting semiconductor laser of the present invention and FIG. 3B is a circuit diagram of a drive circuit for the surface emitting semiconductor laser of the prior art.
Figure 3A:
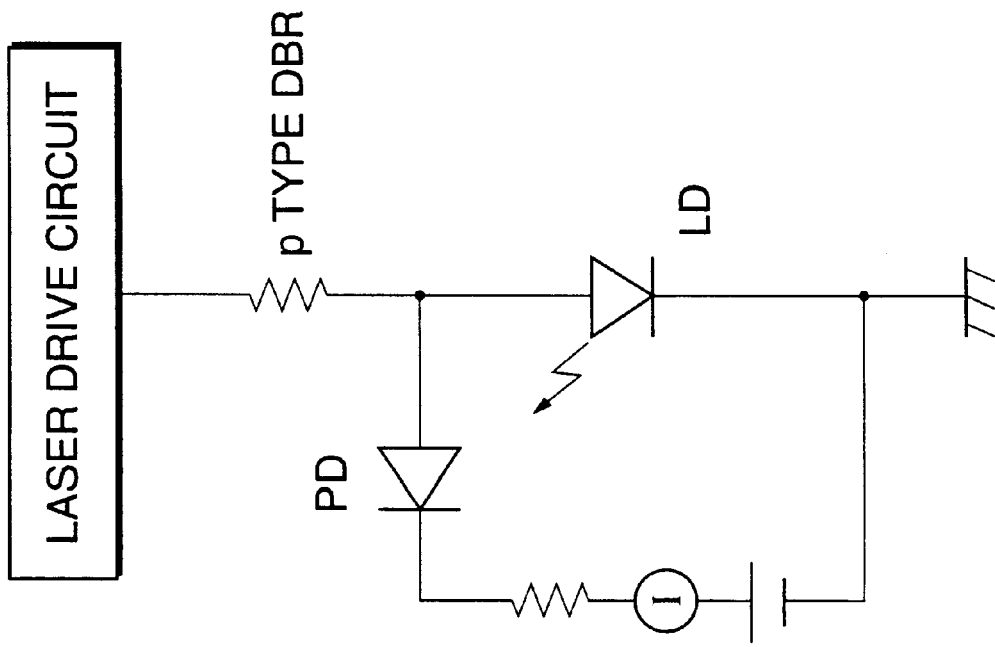

As the wavelength of light absorbed is 780 nm (1.6 eV), when a current value is calculated from this, the current value generated in the optical absorbing layer 1 is 40 $\mu$A. This value can be fully detected by the ammeter. Therefore, when the n type electrode 21 is grounded and a reverse bias of approximately +5 V is applied to the PD electrode 23 from the power source 54 as shown in FIGS. 1A and 1B, carriers generated in the optical absorbing layer can be taken out at a high speed and the light output of a laser beam can be monitored by monitoring the current value at this point with the ammeter 56. At this point, approximately +2 to 3 V is generally applied to the p type electrode 22 as a drive voltage for the surface emitting semiconductor laser. The equivalent circuit is such as shown in FIG. 3A.

As described above, the surface emitting semiconductor laser according to this embodiment can monitor light output by means of the photodetector provided in its structure.

The optical absorbing layer 1 in this embodiment also plays the role of a current strangulation layer. As described above, a pn junction interface is formed between the optical absorbing layer 1 and the p type spacer layer 16b in contact with the optical absorbing layer 1 and between the optical absorbing layer 1 and the p type DBR mirror 17a in contact with the optical absorbing layer 1. The n type layer (optical absorbing layer 1) of the pn junction interface serves as a potential barrier for holes running through the p type DBR mirror 17a. Therefore, a current running from the p type electrode 22 toward the active region 15 through the p type DBR mirror 17a does not pass through the optical absorbing layer 1 but flows concentratedly in the opening 2 devoid of the optical absorbing layer 1. Thus, the optical absorbing layer 1 functions to strangulate a current so that it flows only in a portion near the center line of the waveguide path. This contributes to the improvement of performance of the surface emitting semiconductor laser such as a reduction in threshold value and an increase in efficiency.

Second Embodiment

Figure 7A:
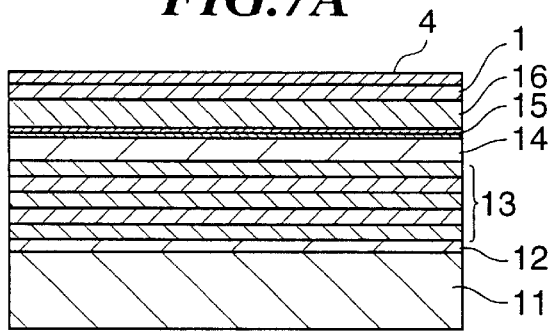
FIGS. 7A to 7E are schematic sectional views showing the production steps of a surface emitting semiconductor laser according to a second embodiment of the present invention.
Figure 7B:
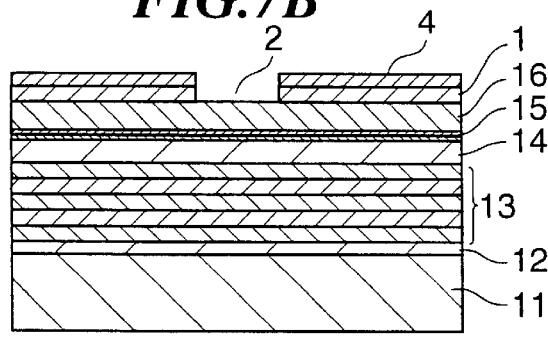
Figure 7C:
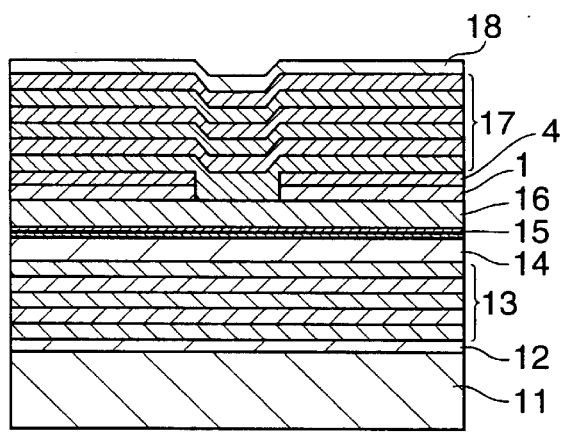
Figure 7D:
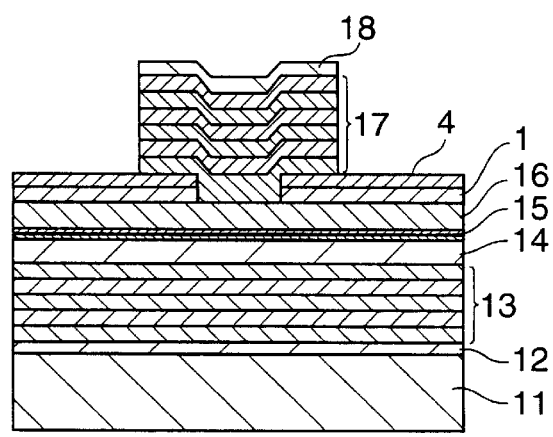
Figure 7E:
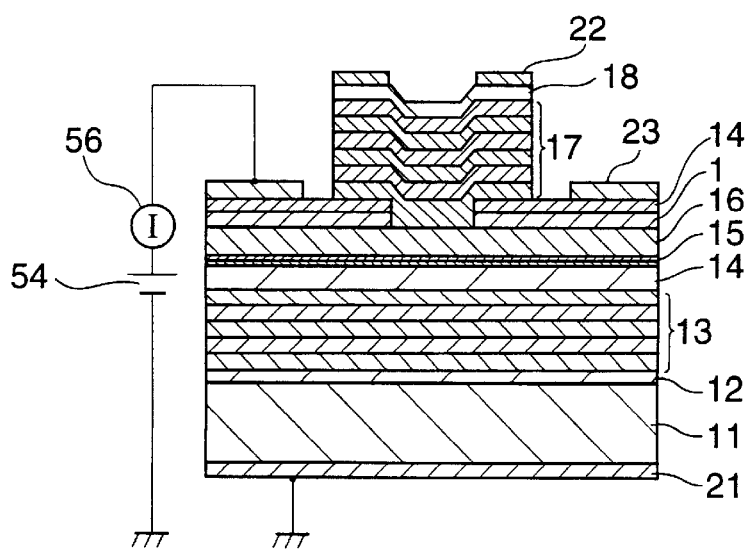

The structure of a surface emitting semiconductor laser according to a second embodiment is shown in FIG. 7E. The surface emitting semiconductor laser according to this embodiment has the same structure as the surface emitting semiconductor laser according to the first embodiment except that the light receiving part is provided with a non-doped GaAs optical absorbing layer 1 and an n type GaAs charge transport layer 4. That is, the optical absorbing layer 1 is an i layer and a pin junction interface is formed. The structure of this surface emitting semiconductor laser will be described with reference to its production process.

As shown in FIG. 7A, completely in the same manner as in the first embodiment, an n type GaAs buffer layer 12, an n type $Al_{0.3}Ga_{0.7}As/Al_{0.9}Ga_{0.1}As$ DBR mirror 13, an $Al_{0.6}Ga_{0.4}As$ spacer layer 14, an $Al_{0.1}Ga_{0.9}As/Al_{0.3}Ga_{0.7}As$ active region 15 and an $Al_{0.6}Ga_{0.4}As$ spacer layer 16 are grown on a conductive Si doped n type GaAs substrate 11 sequentially. A non-doped GaAs optical absorbing layer 1 (thickness of 100 nm) and an n type GaAs charge transport layer 4 (thickness of 100 nm, carrier concentration of $2\times10^{18}/cm^3$) are formed on this laminate in the order named.

This laminate sample is taken out from an MOCVD system and the center portions of the non-doped GaAs optical absorbing layer 1 and the n type GaAs charge transport layer 4 are removed by etching as shown in FIG. 7B to form a circular opening 2 having a diameter of 5 μm.

This sample is set in the MOCVD apparatus again to grow a p type $Al_{0.3}Ga_{0.7}As/Al_{0.9}Ga_{0.1}As$ DBR mirror 17 (64.5 nm/57.6 nm×30 cycles, carrier concentration of $2\times10^{18}/cm^3$) and a p type contact layer 18 (9 nm, carrier concentration of $1\times10^{19}/cm^3$) on the surface of this sample sequentially as shown in FIG. 7C.

As shown in FIG. 7D, the sample which has gone through crystal growth is etched into a cylindrical form having a diameter of 20 μm from the surface. Etching is stopped before the n type GaAs charge transport layer 4.

Finally, an n type electrode 21 (AuGe alloy) is formed on the entire rear surface of the n type GaAs substrate 11 as an electrode for injecting a current into the laser active region 15, a p type electrode 22 (AuZn alloy) is formed on a part excluding a light output port having a diameter of 5 μm of the front surface of the p type contact layer 18, and a PD electrode 23 (AuGe alloy) for taking out electrons generated in the non-doped GaAs optical absorbing layer 1 is formed on the n type GaAs charge transport layer 4. These electrodes are formed to a thickness of 300 nm by evaporation deposition and the PD electrode 23 is connected to the power source 54 through the ammeter 56, thereby obtaining a surface emitting semiconductor laser having a photodetector shown in FIG. 7E.

The surface emitting semiconductor laser Ad according to this embodiment can monitor light output by means of the photodetector provided in its structure like the surface emitting semiconductor laser according to the first embodiment. Since the i layer (optical absorbing layer) of the light receiving part is as thick as 100 nm and its optical absorption is large, a current generated in the optical absorbing layer is large, thereby making it possible to increase the light monitoring sensitivity.

Third Embodiment

A surface emitting semiconductor laser according to a third embodiment has the same structure as the surface emitting semiconductor laser according to the first embodiment except that the light receiving part is provided with a non-doped GaAs optical absorbing layer 1, an n type charge transport layer 4 and a p type PD-p layer 5 as shown in FIG. 8 and the spacer layer 16 overlying the active region is a non-doped layer. That is, a pin junction interface is formed in the light receiving part. Since the surface emitting semiconductor laser according to this embodiment can be produced in the same manner as in the surface emitting semiconductor laser according to the first embodiment, only differences from the first embodiment will be described hereunder.

As for the three layers forming the light receiving part, after the non-doped spacer layer 16 overlying the active region 15 is grown, a p type $Al_{0.9}Ga_{0.1}As$ PD-p layer 5 (thickness of 50 nm, carrier concentration of $2\times10^{18}/cm^3$), a non-doped GaAs optical absorbing layer 1 (thickness of 50 nm) and an n type GaAs charge transport layer 4 (thickness of 100 nm, carrier concentration of $2\times10^{18}/cm^3$) are formed on the non-doped spacer layer 16 sequentially.

Thereafter, the center portion of the optical waveguide path of the surface emitting semiconductor laser is removed by etching to form a circular opening 2 having a diameter of 5 μm. In the same manner as in the first embodiment, a p type $Al_{0.3}Ga_{0.7}As/Al_{0.9}Ga_{0.1}As$ DBR mirror 17 (64.5 nm/57.6 nm×30 cycles, carrier concentration of $2\times10^{18}/cm^3$) and a p type contact layer 18 (9 nm, carrier concentration of $1\times10^{19}/cm^3$) are then grown. Since crystals are not grown on the $SiO_2$ film (selective growth), the p type DBR mirror 17 has the same shape as shown in FIG. 4C.

Finally, an n type electrode 21 (AuGe alloy) is formed on the entire rear surface of the n type GaAs substrate 11, a p type electrode 22 (AuZn alloy) is formed on a portion excluding a light output port having a diameter of 5 μm of the p type contact layer 18, and an n type PD electrode 23 (AuGe alloy) is formed on the charge transport layer 4. A surface emitting semiconductor laser having a photodetector is obtained by connecting this PD electrode 23 to the power source 54 through the ammeter 56.

The surface emitting semiconductor laser according to this embodiment can monitor light output by means of the photodetector provided in its structure like the surface emitting semiconductor laser according to the first embodiment. The thickness of the i layer (optical absorbing layer) of the light receiving part can be freely changed, thereby making it possible to control optical sensitivity.

Since the charge transport layer 4 does not absorb light, it has a very small optical loss and does not deteriorate the characteristic properties of the laser, and the p type PD-p layer 5 has a large band gap. Therefore, it is possible to prevent electrons overflown from the active region 15 from flowing into the optical absorbing layer 1 and the charge transport layer 4.

In this embodiment, the n type charge transport layer 4 and the non-doped GaAs optical absorbing layer 1 are directly joined together. When a graded layer having a thickness of approximately 20 nm formed by gradually changing the proportion of Al to 0 to 20% is inserted between the optical absorbing layer and the charge transport layer to prevent the formation of a spike-like barrier for conduction band potential, charge generated in the optical absorbing layer 1 can be moved to the charge transport layer 4 smoothly. That is, when the light receiving part is provided with an optical absorbing layer, graded layer and charge transport layer, the performance of the photodetector is improved.

Fourth Embodiment

Figure 9A:
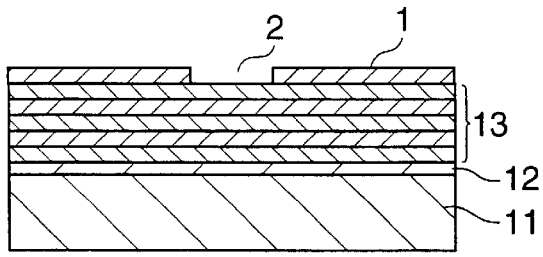
FIGS. 9A to 9E are schematic sectional views showing the production steps of a surface emitting semiconductor laser according to a fourth embodiment of the present invention.
Figure 9B:
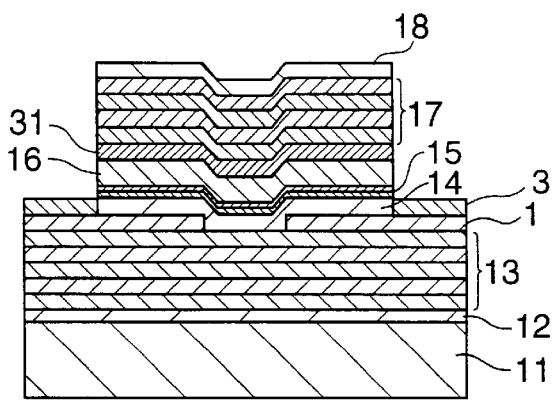
Figure 9C:
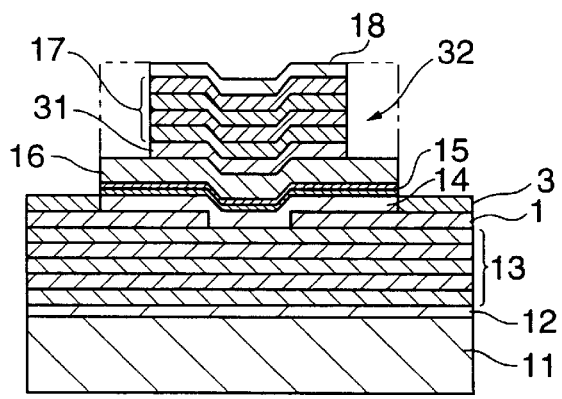
Figure 9D:
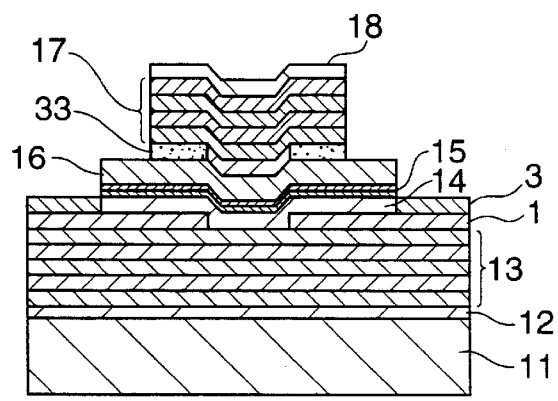
Figure 9E:
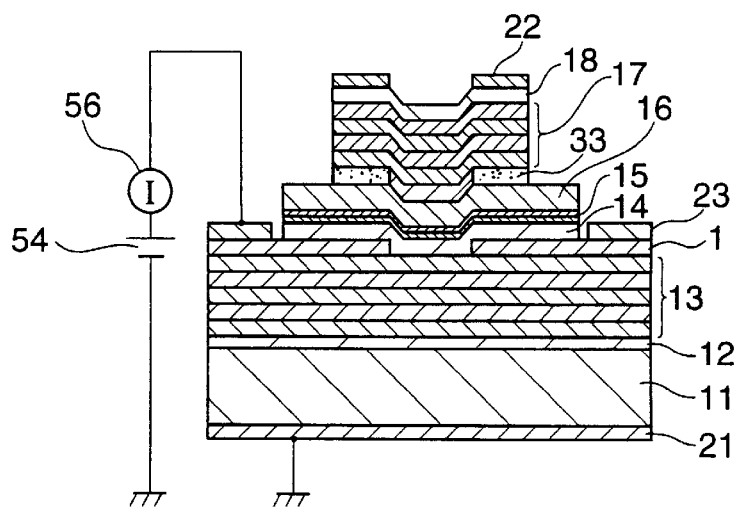

A fourth embodiment of the present invention is a selective oxidation surface emitting semiconductor laser having a photodetector (PD) shown in FIG. 9E. The structure of this semiconductor laser will be described hereunder with reference to its production process.

As shown in FIG. 9A, an n type GaAs buffer layer 12 (thickness of 0.2 $\mu$m, carrier concentration of $2\times10^{18}/cm^3$) and an n type $Al_{0.3}Ga_{0.7}As/Al_{0.9}Ga_{0.1}As$ DBR mirror 13 (57.6 nm/64.5 nm×40.5 cycles, $Al_{0.3}Ga_{0.7}As$ on an upper side/$Al_{0.9}Ga_{0.1}As$ on a lower side, carrier concentrate of $2\times10^{18}/cm^3$) are formed on a conductive Si-doped n type GaAs substrate 11, and a p type GaAs optical absorbing layer 1 (thickness of 100 nm, carrier concentration of $2\times10^{18}/cm^3$) is grown on this laminate. This sample is taken out from a crystal growing apparatus, and the center portion of the p type GaAs optical absorbing layer 1 is removed by etching to form a circular opening 2 having a diameter of 5 $\mu$m. Further, an $SiO_2$ insulating film 3 (thickness of 0.2 $\mu$m) is formed on this optical absorbing layer 1 by plasma CVD and an opening having a diameter of 30 $\mu$m which is larger than the opening 2 is formed in this $SiO_2$ insulating film by etching to expose part of the optical absorbing layer 1 to the surface.

The sample is set in the crystal growing apparatus again to form an $Al_{0.6}Ga_{0.4}As$ spacer layer 14 (98.2 nm), an $Al_{0.1}Ga_{0.9}As/Al_{0.3}Ga_{0.7}As$ (quantum well layer/barrier layer: 8 nm/5 nm×3 cycles, non-doped) active region 15 and an $Al_{0.6}Ga_{0.4}As$ spacer layer 16 (98.2 nm, non-doped) sequentially as shown in FIG. 9B. Thereafter, a p type $Al_{0.98}Ga_{0.02}As$ layer 31 (65.4 nm, carrier concentration of $2\times10^{18}/cm^3$) is grown and a p type $Al_{0.9}Ga_{0.1}As$ (upper side)/$Al_{0.3}Ga_{0.7}As$ (lower side) multi-layer mirror 17 (64.5 nm/57.6 nm×29.5 cycles, carrier concentration of $2\times10^{18}/cm^3$) and p type contact layer 18 (9 nm, carrier concentration of $1\times10^{19}/cm^3$) are grown on the layer 31 sequentially for selective oxidation.

The $Al_{0.6}Ga_{0.4}As$ spacer layer 14 (98.2 nm) has an n type spacer layer 14a (40 nm) in contact with the p type GaAs optical absorbing layer 1 and a non-doped spacer layer 14b (58.2 nm) formed on the spacer layer 14a. Since crystals are not grown on the $SiO_2$ film, layers from the spacer layer 14 to the p type contact layer 18 are laminated together like a cylinder having a diameter of 30 $\mu$m.

As shown in FIG. 9C, the sample is taken out from the crystal growing apparatus and the side wall of the cylinder having a diameter of 30 $\mu$m up to the p type $Al_{0.98}Ga_{0.02}As$ layer 31 is removed by etching and layers from the p type $Al_{0.98}Ga_{0.02}As$ layer 31 to the p type contact layer 18 are formed into a cylindrical form having a diameter of 20 $\mu$m. This is a process for exposing the sections of layers to be subjected to selective oxidation to the side wall of the cylinder without fail. In this embodiment, the position of the depth at which etching is stopped is above the spacer layer 16. It may be anywhere if it is below the p type $Al_{0.98}Ga_{0.02}As$ layer 31 and above the n type GaAs optical absorbing layer 1.

This sample is then kept at 400° C. in a steam atmosphere. As shown in FIG. 9D, only the p type $Al_{0.98}Ga_{0.02}As$ layer 31 is oxidized from the periphery toward the interior, thereby forming a doughnut-shaped oxidized region 33. In approximately 10 minutes, all the portions of the p type $Al_{0.98}Ga_{0.02}As$ layer 31 are oxidized excluding an unoxidized center region having a diameter of 5 $\mu$m. The oxidized region 33 is made from insulating $Al_2O_3$, thereby forming a current strangulation structure that a current runs only in the unoxidized region.

Finally, the $SiO_2$ film 3 is removed and an n type PD electrode 23 (AuGe alloy) is formed on the p type optical absorbing layer 1. A p type electrode 22 (AuZn alloy) is formed on a portion excluding a light output port having a diameter of 5 $\mu$m of the p type contact layer 18, and an n type electrode 21 (AuGe alloy) is formed on the entire rear surface of the n type GaAs substrate 11. A surface emitting semiconductor laser having a photodetector shown in FIG. 9E is obtained by connecting the PD electrode 23 to the power source 54 through the ammeter 56.

The surface emitting semiconductor laser according to this embodiment can monitor light output by means of the photodetector provided in its structure like the surface emitting semiconductor laser according to the first embodiment.

In this embodiment, the optical absorbing layer 1 also serves to reduce a strong light enclosing structure formed by the oxidized region 33 ($Al_2O_3$) having a low refractive index. The enclosing degree of the optical waveguide path becomes appropriate and the light output distribution is apt to become unimodal. That is, the surface emitting semiconductor laser according to this embodiment is also characterized in that a single horizontal mode is easily realized.

Further, current strangulation is carried out by the selectively oxidized region 33 above the active region 15 and the opening 2 below the active region 15. Since the current strangulation structure is thus formed firmly, a current is injected into the active region 15 efficiently and the surface emitting semiconductor laser has excellent characteristic properties.

Fifth Embodiment

Figure 10:
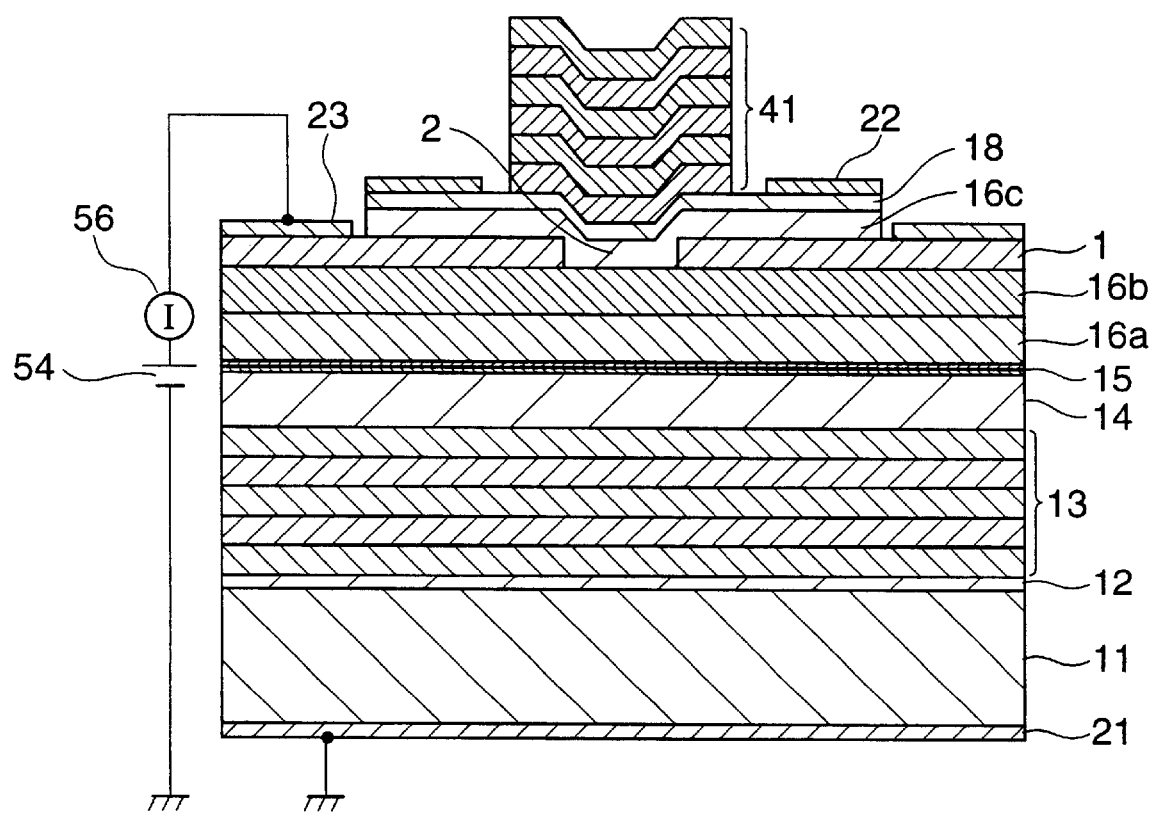
FIG. 10 is a schematic sectional view showing the layer structure of a surface emitting semiconductor laser according to a fifth embodiment of the present invention.

A fifth embodiment of the present invention is an intra-cavity type surface emitting semiconductor laser having a photodetector (PD) shown in FIG. 10. The structure of the semiconductor laser will be described hereunder with reference to its production process.

In the same manner as in the first embodiment, an n type GaAs buffer layer 12 (thickness of 0.2 $\mu$m, carrier concentration of $2\times10^{18}cm^3$), an n type $Al_{0.3}Ga_{0.7}As/Al_{0.9}Ga_{0.1}As$ DBR mirror 13 (57.6 nm/64.5 nm×40.5 cycles, $Al_{0.3}Ga_{0.7}As$ on an upper side/$Al_{0.9}Ga_{0.1}As$ on a lower side, carrier concentration of $2\times10^{18}/cm^3$), an $Al_{0.6}Ga_{0.4}As$ spacer layer 14 (98.2 nm, non-doped), an $Al_{0.1}Ga_{0.9}As/Al_{0.3}Ga_{0.7}As$ (quantum well layer/barrier layer: 8 nm/5 nm×3 cycles, non-doped) active region 15, $Al_{0.6}Ga_{0.4}As$ spacer layer 16a (98.2 nm), a p type $Al_{0.6}Ga_{0.4}As$ spacer layer 16b (73 nm, carrier concentration of $2\times10^{18/cm3}$) and an n type GaAs optical absorbing layer 1 (thickness of 100 nm, carrier concentration of $2\times10^{18}/cm^3$) are formed on a conductive Si-doped n type GaAs substrate 11 sequentially.

This sample is taken out from the crystal growing apparatus and the center portion of the n type GaAs optical absorbing layer 1 is removed by etching to form an opening 2.

The sample is set in the crystal growing apparatus again to grow a p type $Al_{0.6}Ga_{0.4}As$ spacer layer 16c (160 nm, carrier concentration of $2\times10^{18}/cm^3$) and a p type contact layer 18 (10 nm, carrier concentration of $1\times10^{19}/cm^3$) sequentially. In this embodiment, the spacer tilt layer 16 (including the contact layer 18) and the active region 15 have an optical path length of 2 $\lambda$ and the two DBR mirrors sandwiching these play the role of a laser resonator.

An Si (upper side)/$SiO_2$ (lower side) dielectric DBR mirror 41 (273/520 nm×5 cycles) is formed on the surface of this sample by EB evaporation deposition. Thereafter, the dielectric DBR mirror 41 is etched into a cylindrical form having a diameter of 10 $\mu$m. The p type $Al_{0.6}Ga_{0.4}As$ spacer layer 16 and the p type contact layer 18 are then etched into a disk form having a diameter of 20 $\mu$m to expose part of the surface of the n type GaAs optical absorbing layer 1.

Finally, an n type electrode 21 (AuGe alloy) is formed on the entire rear surface of the n type GaAs substrate 11, a p type electrode 22 (AuZn alloy) is formed on a portion excluding a light output port having a diameter of 5 $\mu$m of the p type contact layer 18, an n type PD substrate 23 (AuGe alloy) is formed on the n type optical absorbing layer 1, and a PD substrate 23 is connected to the power source 54 through the ammeter 56, thereby obtaining a surface emitting semiconductor laser having a photodetector shown in FIG. 10.

In the surface emitting semiconductor laser according to this embodiment, a current is not caused to run in the upper DBR mirror 41 but caused to run from the p type spacer layer 16. The n type optical absorbing layer 1 is contacted to the p type spacer layer 16 to form a pn junction interface and use it as a light receiving part. Thereby, the surface emitting semiconductor laser according to this embodiment can monitor light output by means of the photodetector provided in its structure like the surface emitting semiconductor laser according to the first embodiment.

Since the upper DBR mirror 41 can be made from a dielectric material in this embodiment, a DBR mirror having high reflectance can be manufactured with a small number of cycles. The n type optical absorbing layer 1 plays the role of a current strangulation layer to improve the characteristic properties of the laser.

Sixth Embodiment

A surface emitting semiconductor laser according to a sixth embodiment is a modification of the surface emitting semiconductor laser according to the fifth embodiment in which the light receiving part is provided outside the path of a drive current for the surface emitting semiconductor laser. The structure of the semiconductor laser will be described hereunder with reference to FIG. 11.

Figure 11:
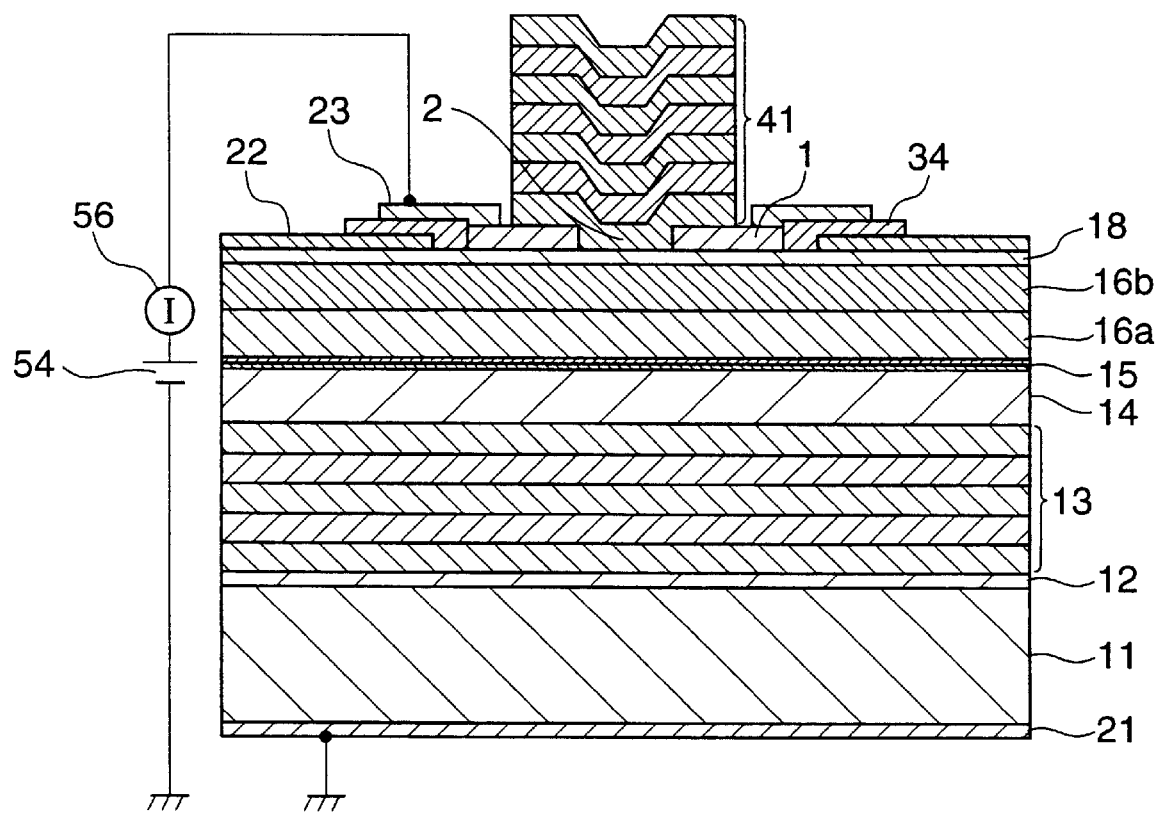
FIG. 11 is a schematic sectional view showing the laser structure of a surface emitting semiconductor laser according to a sixth embodiment of the present invention.

As shown in FIG. 11, in this embodiment, completely in the same manner as in the fifth embodiment, an n type GaAs buffer layer 12, an n type $Al_{0.3}Ga_{0.7}As/Al_{0.9}Ga_{0.1}As$ DBR mirror 13, an $Al_{0.6}Ga_{0.4}As$ spacer layer 14, an $Al_{0.1}Ga_{0.9}As/Al_{0.3}Ga_{0.7}As$ quantum well active region 15, an $Al_{0.6}Ga_{0.4}As$ spacer layer 16a, a p type $Al_{0.6}Ga_{0.4}As$ spacer layer 16b (233 nm, carrier concentration of $2\times10^{18}/cm^3$) a p type contact layer 18 (10 nm, carrier concentration of $1\times10^{19}/cm^3$) and an n type GaAs optical absorbing layer 1 (thickness of 100 nm, carrier concentration of $2\times10^{18}/cm^3$) are formed on a conductive Si-doped n type GaAs substrate 11 sequentially.

This sample is taken out from the crystal growing apparatus and the center portion of the n type GaAs optical absorbing layer 1 is removed by etching to form an opening 2 having a diameter of 3 $\mu$m. The peripheral portion of the n type GaAs optical absorbing layer 1 is removed by etching to ensure that the outer diameter of the optical absorbing layer 1 should become 15 $\mu$m. An $Si/SiO_2$ dielectric DBR mirror 41 is formed on this optical absorbing layer 1 and then etched to form a cylinder having a diameter of 7 $\mu$m.

Finally, an n type electrode 21 is formed on the entire rear surface of the n type GaAs substrate 11, and a p type electrode 22 is formed on the p type contact layer 18 outside the n type GaAs optical absorbing layer 1 having a diameter of 15 $\mu$m. An n type PD electrode 23 is formed on the n type optical absorbing layer 1 after an $SiO_2$ insulating film 34 is formed on the p type electrode 22 to a thickness of 0.2 $\mu$m so that the n type PD electrode 23 is separated from the p type electrode 22. A surface emitting semiconductor laser having a photodetector shown in FIG. 11 is obtained by connecting this PD electrode 23 to the power source 54 through the ammeter 56.

The surface emitting semiconductor laser according to this embodiment can monitor light output by means of the photodetector provided in its structure like the surface emitting semiconductor laser according to the first embodiment. In this embodiment, the optical absorbing layer does not function as a current strangulation layer but plays only the role of monitoring light output.

Seventh Embodiment

Figure 12A:
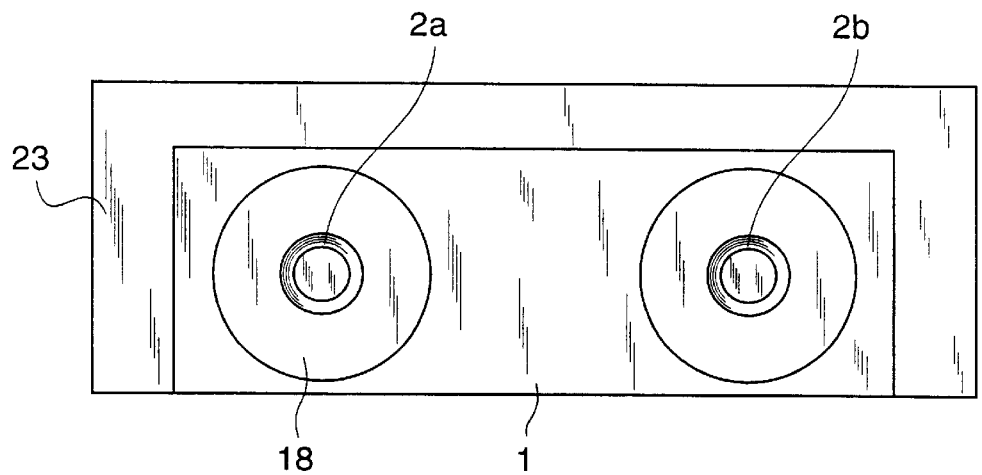
FIG. 12A is a top view of a surface emitting semiconductor laser array according to a seventh embodiment of the present invention and FIG. 12B is a schematic sectional view of the layer structure of the surface emitting semiconductor laser array according to the seventh embodiment of the present invention.
Figure 12B:
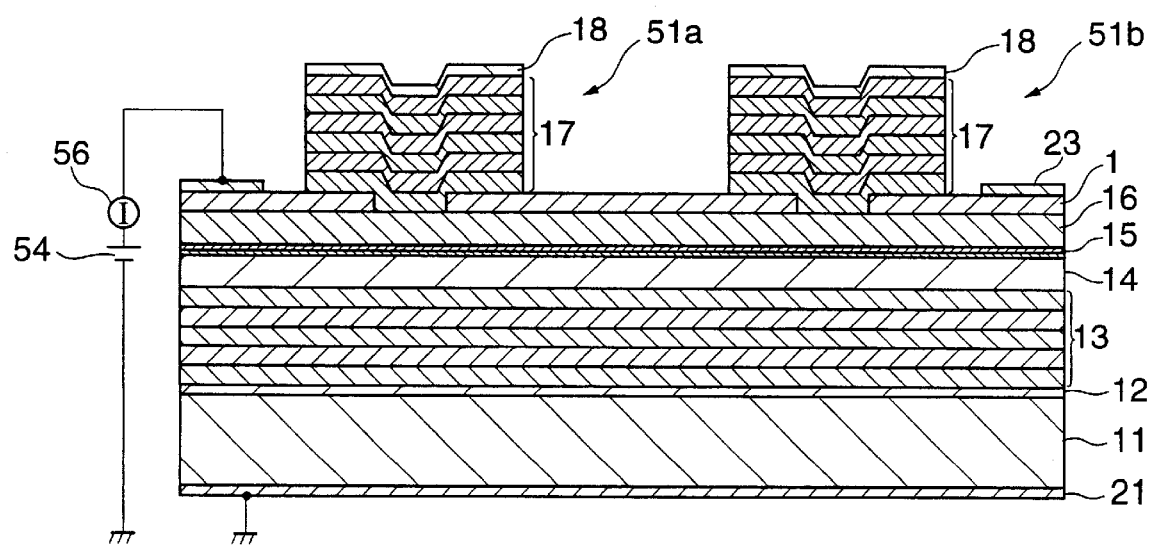

A seventh embodiment of the present invention is a surface emitting semiconductor laser array which includes two surface emitting semiconductor lasers having a pn junction photodetector (PD) formed of an n type GaAs optical absorbing layer which is a light receiving part inserted between the p type DBR layer 17 and the spacer layer 16. FIG. 12A is a top view of the surface emitting semiconductor laser array according to the seventh embodiment and FIG. 12B is a sectional view thereof. The structure of the semiconductor laser array will be described hereunder with reference to its production process.

Completely in the same manner as in the first embodiment, an n type GaAs buffer layer 12, an n type $Al_{0.3}Ga_{0.7}As/Al_{0.9}Ga_{0.1}As$ DBR mirror 13, an $Al_{0.6}Ga_{0.4}As$ spacer layer 14, an $Al_{0.1}Ga_{0.9}As/Al_{0.3}Ga_{0.7}As$ (quantum well layer/barrier layer: 8 nm/5 nm×3 cycles, non-doped) active region 15, an $Al_{0.6}Ga_{0.4}As$ spacer layer 16 (98.2 nm, non-doped) and an n type GaAs optical absorbing layer 1 are formed on a conductive Si-doped n type GaAs substrate 11 sequentially.

This sample is taken out from the MOCVD apparatus and the center portion of the n type GaAs optical absorbing layer 1 is removed by etching to form two circular openings having a diameter of 5 $\mu$m as shown in FIG. 12A (opening 2a and opening 2b). In this embodiment, the number of openings 2 is two as the simplest example and the same number of openings as that of desired multiple beams can be formed.

The optical absorbing layer 1 is formed on the entire flat surface of the substrate and the optical absorbing layers 1 of each laser are electrically connected to each other. An $SiO_2$ insulating film (thickness of 0.1 $\mu$m) is formed on the optical absorbing layer 1 by plasma CVD and openings having a diameter of 20 μm which are larger than the openings 2 are formed in the SiO$_2$ insulating film to expose part of the optical absorbing layer 1 to the surface.

This sample is set in the MOCVD apparatus again, to grow a p type Al$_{0.3}$Ga$_{0.7}$As/Al$_{0.9}$Ga$_{0.1}$As DBR mirror 17 and a p type contact layer 18 on the surface of this sample sequentially. Since crystals do not grow on the SiO$_2$ film (selective growth), a post-shaped p type DBR mirror 17 is formed. The SiO$_2$ film is removed by etching, an n type electrode 21 (AuGe alloy) is formed on the entire rear surface of the n type GaAs substrate 11 as an electrode for injecting a current into the laser active region, and a p type electrode 22 (AuZn alloy) is formed on a portion excluding a light output port having a diameter of 5 μm of the front surface of the p type contact layer 18 of each element. Surface emitting semiconductor laser elements thus manufactured are designated 51a and 51b.

As shown in FIG. 12B, one PD electrode 23 (AuGe alloy) for taking out electrons generated in the n type GaAs optical absorbing layer 1 is formed on the optical absorbing layer 1. A surface emitting semiconductor laser array having a photodetector is obtained by connecting this PD electrode 23 to the power source 54 through the ammeter 56.

The surface emitting semiconductor laser array according to this embodiment can monitor light output by means of the photodetector provided in its structure like the surface emitting semiconductor laser according to the first embodiment.

In this embodiment, the potential of the n type electrode 21 for driving a laser is fixed at 0 V, the potential of the PD electrode 23 is fixed at 5 V, the potential of the p type electrode 22 is set free to drive each laser independently. Since a reverse bias voltage applied to the photodetector remains unchanged at the time of driving the lasers, laser light can be monitored stably. This is because the electric resistance of the n type DBR mirror 13 is much smaller than that of the p type DBR mirror 17 and can be ignored. Stated more specifically, since the electric resistivity of the n type DBR mirror 13 material can be approximately 1/10 and the cross section of its current path can be 100 times or more that of the p type DBR mirror 17, the electric resistance of the n type DBR mirror 13 is approximately 1/1,000 that of the p type DBR mirror 17 and can be ignored. That is, as a voltage drop caused by electric resistance occurs in the p type DBR mirror 17, even if the current value for driving each laser changes, the voltage between the grounded n type electrode 21 for driving a laser and the PD electrode 23 remains unchanged and almost fixed.

Figure 2A:
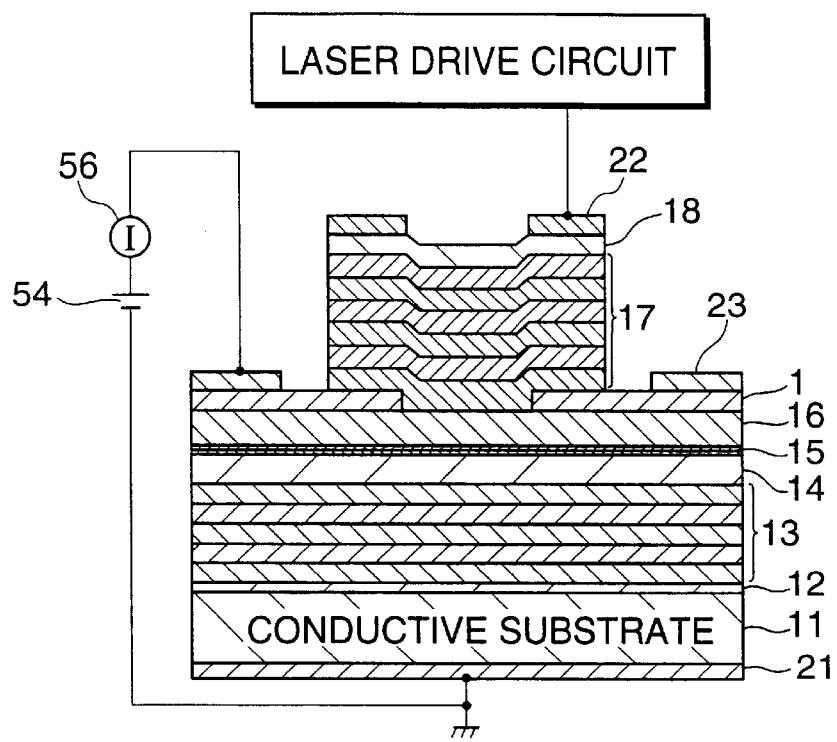
FIG. 2A schematically shows the method of driving the surface emitting semiconductor laser of the present invention and FIG. 2B schematically shows the method of driving the surface emitting semiconductor laser array of the present invention.
Figure 2B:
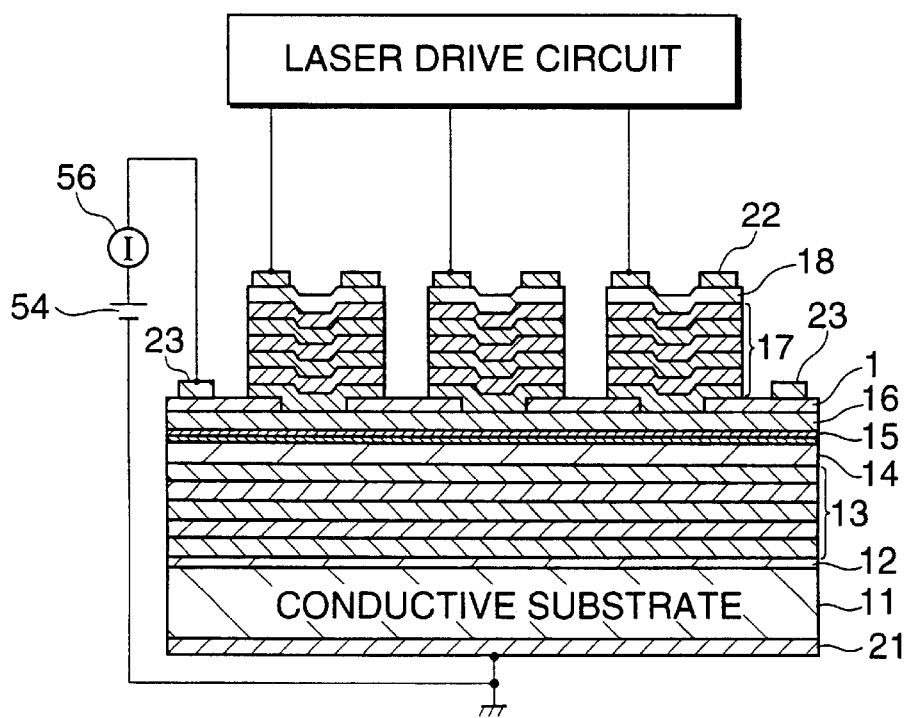
Figure 15A:
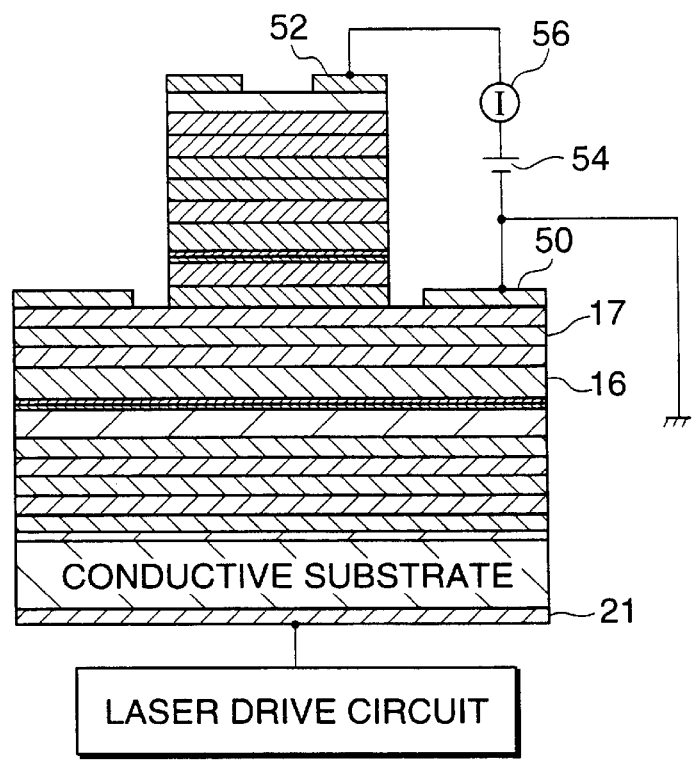
FIG. 15A schematically shows the method of driving a surface emitting semiconductor laser of the prior art and FIG. 15B schematically shows the method of driving a surface emitting semiconductor laser array of the prior art.
Figure 15B:
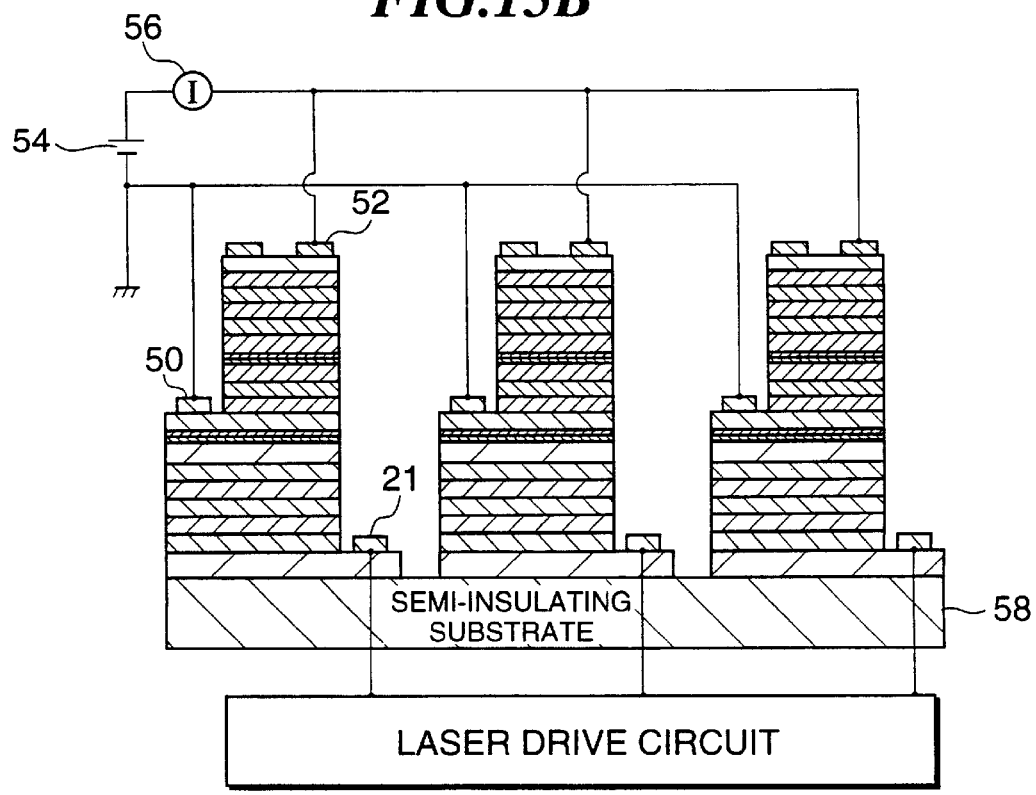

Therefore, in the present invention, it is not necessary to drive each laser by grounding the p type electrode 50 for driving a laser as a common electrode and operating the potential of the n type electrode 21 for driving a laser formed on the rear surface of the substrate unlike the conventional photodetector shown in FIG. 15A. That is, while the n type electrode 21 for driving a laser is grounded as a common electrode and a fixed reverse bias is applied to the PD electrode 23 as shown in FIG. 2A, each laser can be activated by operating the potential of the p type electrode 22 for driving a laser. At the same time, the light intensity of each laser can be monitored with the photodetector.

In this embodiment, the number of laser elements is two and the number of the PD electrodes 23 is one. In addition, the potential of the PD electrode 23 may be fixed, thereby making it possible to simplify the drive circuit of the photodetector and to monitor laser light output from a large number of elements at a low cost.

Eighth Embodiment

A surface emitting semiconductor laser array according to an eighth embodiment is a surface emitting semiconductor laser array including the surface emitting semiconductor lasers of the seventh embodiment disposed in an array. The structure of the surface emitting semiconductor laser array will be described with reference to its production process. Since the laminate structure of the surface emitting semiconductor laser is the same as that of the seventh embodiment, its description is omitted.

Figure 13:
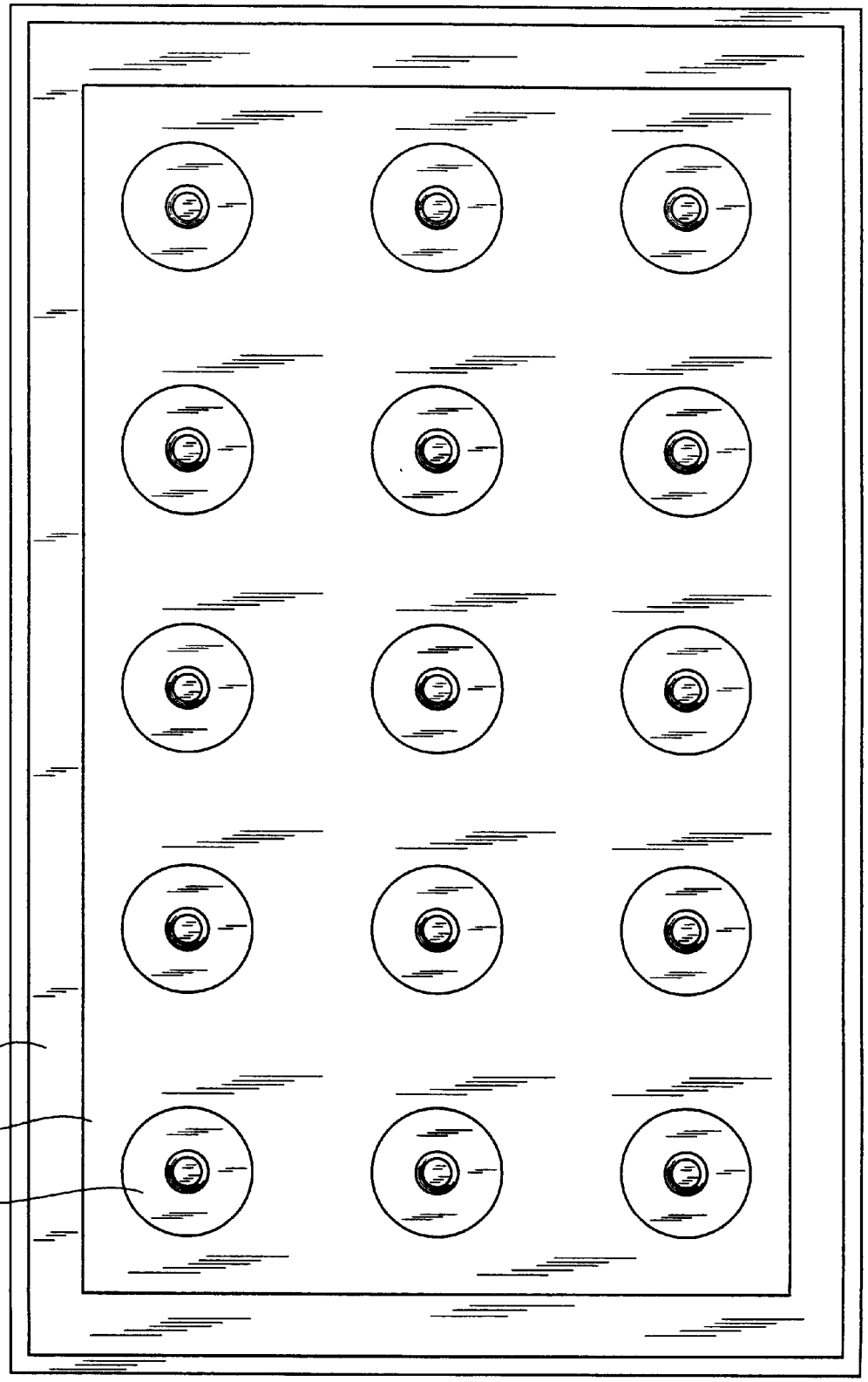
FIG. 13 is a top view showing the arrangement of the elements of a surface emitting semiconductor laser array according to an eighth embodiment of the present invention.

In this embodiment, surface emitting semiconductor laser elements 51 are disposed in 3 rows and 5 columns as shown in FIG. 13. An optical absorbing layer 1 is formed on the entire flat surface of a substrate and the optical absorbing layers 1 of all the laser elements 51 are electrically connected to one another. That is, one photodetector is provided for 15 laser elements.

Since the drive circuit is independent, the relationship between the current value and light output of each laser can be measured one by one. That is, the relationship between the current and light output of each of all the lasers can be obtained with one photodetector.

In this embodiment, as shown in FIG. 14, the optical absorbing layers 1 in respective rows can be electrically insulated from one another. Three band-like optical absorbing layers 1a, 1b and 1c are formed in respective rows and electrically insulated from one another. PD electrodes 23a, 23b and 23c formed on the optical absorbing layers 1a, 1b and 1c are electrically insulated from one another, respectively. In this structure, the relationship between the current and light output of each of the laser elements in the first row can be measured with the PD electrode 23a sequentially. The relationships between the currents and light outputs of the laser elements in the same column can be measured simultaneously, thereby making it possible to shorten the detection time.

In the first to eighth embodiments, the surface emitting semiconductor lasers made from an AlGaAs-based material have been described. It is needless to say that the present invention can be applied to a surface emitting semiconductor laser made from a group III to V compound semiconductor material such as an AlGaInN-based material or AlGaInP-based material or a surface emitting semiconductor laser made from a group II to VI compound semiconductor material such as a CdZnSSe-based material.

In the first to eighth embodiments, the opening of the optical absorbing layer is circular. The opening 3 is not limited to this but may be oval, square, rectangular or polygonal, or slit-form for dividing the light receiving part into two or more. Particularly, when the opening of the light receiving part is oval, rectangular or slit-form, the plane of polarization in a longitudinal direction of the shape can be controlled.

As having been described above, since a light receiving part for absorbing light is nonexistent near the center line having the highest light intensity of the optical waveguide path of the surface emitting semiconductor laser of the present invention but existent only in the peripheral region having low light intensity of the waveguide path, the light output of the surface emitting semiconductor laser can be monitored without deteriorating the performance of the surface emitting semiconductor laser.

In the photodetector having a pin junction structure or pin junction structure inserted into the structure of a surface emitting semiconductor laser, carriers generated in the light receiving part can be taken out easily at a high speed by applying a reverse bias. In the structure of the prior art in which the laminate structure of a surface emitting semiconductor laser is directly used for a photodetector, a quantum well which is an optical absorbing layer has a potential well structure and carriers generated in the quantum well are hardly taken out to the outside and the detection current is small.

A portion near the spacer layer of the surface emitting semiconductor laser is a region where the quantity of light is 100 to 200 times the quantity of light output to the outside and the base portion of the distribution function of this quantity of light can be detected by the photodetector. Therefore, the photodetector provided with a relatively thin optical absorbing layer can absorb a sufficient quantity of light and converts it into a current.

Since a reverse bias can be directly applied to the pn junction or pin junction interface of the light receiving part by applying voltage to the electrode of the light receiving part, carriers can be taken out at a high speed. That is, the quantity of light can be monitored at a high speed.

Since the light receiving part of the photodetector is nonexistent on the center line in a resonance direction of the optical waveguide path but existent only in the peripheral portion of the optical waveguide path, only the base portion of a convex light intensity distribution is absorbed. That is, the output light intensity distribution is apt to be maintained at a convex single mode.

When the light detection intensity of the photodetector shows an abnormal change, the horizontal mode of light in the optical waveguide path of the surface emitting semiconductor laser changes from single mode to multi-mode. So the present invention can be used as a single-mode detector.

Since a current can be caused to run concentratedly in the opening of the light receiving part, the performance of the laser can be improved. Since the light receiving part has a current strangulation structure, the production process of the laser is easy.

Since the photodetector can be formed in the manufacturing process of the laser, an external photodetector is not required, thereby making it possible to reduce costs.

According to the present invention, there is provided a surface emitting semiconductor laser having a photodetector which can monitor the light output of a laser easily at a high speed. There is also provided a surface emitting semiconductor laser array having a photodetector which can monitor the light output of each laser with a simple structure.

What is claimed is:

1. A surface emitting semiconductor laser which has an active region, a pair of spacer layers sandwiching the active region, a pair of DBR mirrors sandwiching the pair of spacer layers, and a pair of laser drive electrodes sandwiching a region including at least the pair of spacer layers and which outputs laser light from an optical waveguide path in the laser by applying voltage to the laser drive electrodes, and also has a photodetector, the photodetector comprising:

a light receiving part which is provided at least in the optical waveguide path except the centerline of the optical waveguide path, and generates carriers by absorbing laser light emitted from the active layer; and a light receiving part electrode which takes out the carriers generated by the light receiving part.

2. The surface emitting semiconductor laser of claim 1, wherein the light receiving part is formed on the entire peripheral portion of the optical waveguide path.

3. The surface emitting semiconductor laser of claim 1, wherein the light receiving part has an interface in contact with the top or bottom of the layers constituting the surface emitting semiconductor laser at least on one side and pn junction or pin junction is formed at the interface or near the interface.

4. The surface emitting semiconductor laser of claim 3, wherein the light receiving part has a first conductive site and the layers constituting the surface emitting semiconductor laser in contact with the light receiving part has a second conductive site.

5. The surface emitting semiconductor laser of claim 1, wherein the light receiving part comprises an optical absorbing layer which absorbs the laser light and a conductive charge transport layer which transports the carriers generated in the optical absorbing layer to the light receiving part electrode.

6. The surface emitting semiconductor laser of claim 5, wherein the optical absorbing layer is a non-doped i layer and the light receiving part electrode is electrically connected to the charge transport layer.

7. The surface emitting semiconductor laser of claim 5, wherein the light receiving part is inserted into a path of a current running from the pair of laser drive electrodes.

8. The surface emitting semiconductor laser of claim 7, wherein the light receiving part has a first conductive site, one of the pair of DBR mirrors has a second conductive site, and the light receiving part is formed in the inside or an end portion of the DBR mirror having the second conductive site.

9. The surface emitting semiconductor laser of claim 8, wherein the light receiving part is formed at an interface between the DBR mirror and the spacer layer having the second conductive site or near the interface.

10. The surface emitting semiconductor laser of claim 7, wherein the light receiving part has a first conductive site, one of the pair of spacer layers has a second conductive site on an interface side with the DBR mirror, and the light receiving part is formed in the inside or an end portion of the second conductive site of the spacer layer.

11. The surface emitting semiconductor laser of claim 1, wherein the light receiving part is formed at a surface side outside of the pair of laser drive electrodes.

12. The surface emitting semiconductor laser of claim 11, wherein one of the pair of spacer layers has a second conductive site at an interface side with the DBR mirror, a second conductive laser drive electrode is formed at the second conductive site of the spacer layer, and the light receiving part having a first conductive site is formed at the interface between the second conductive site of the spacer layer and the DBR mirror.

13. The surface emitting semiconductor laser of claim 12, wherein the DBR mirror is composed of dielectric materials.

14. A surface emitting semiconductor laser array, comprising:

surface emitting semiconductor lasers disposed in an array on the same substrate, each surface emitting semiconductor laser having an active region, a pair of spacer layers sandwiching the active region, a pair of DBR mirrors sandwiching the pair of spacer layers, a pair of laser drive electrodes sandwiching at least a region including the pair of spacer layers, and a light receiving part which generates carriers by absorbing the laser beam emitted from the active layer and is formed on at least part of the peripheral portion of an optical waveguide path which the laser beam is passed through; and a light receiving part electrode which is electrically connected to all or some of the light receiving layers of the surface emitting semiconductor lasers to detect the carriers generated at the light receiving part.

15. The surface emitting semiconductor laser array according to claim 14, further comprising:

a pair of laser drive electrodes one of which is provided on the substrate as a common electrode and the other is connected to a drive circuit; and a power source which maintains the light receiving part electrode at a predetermined potential while a reverse bias is applied to the light receiving parts.

* * * * *